(12) United States Patent
Lee et al.

(10) Patent No.: US 11,532,691 B2
(45) Date of Patent: Dec. 20, 2022

(54) TRANSPARENT DISPLAY DEVICE

(71) Applicant: LG Display Co., Ltd., Seoul (KR)

(72) Inventors: Soyi Lee, Paju-si (KR); ChangSoo Kim, Paju-si (KR); EuiTae Kim, Paju-si (KR); KiSeob Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 77 days.

(21) Appl. No.: 17/132,676

(22) Filed: Dec. 23, 2020

(65) Prior Publication Data

US 2021/0202683 A1 Jul. 1, 2021

(30) Foreign Application Priority Data

Dec. 30, 2019 (KR) .................. 10-2019-0177869

(51) Int. Cl.
| | |
|---|---|
| *G06F 3/038* | (2013.01) |
| *G09G 5/00* | (2006.01) |
| *H01L 27/32* | (2006.01) |
| *G09G 3/3225* | (2016.01) |
| *G09G 3/00* | (2006.01) |
| *H01L 51/52* | (2006.01) |

(52) U.S. Cl.
CPC ......... *H01L 27/3279* (2013.01); *G09G 3/006* (2013.01); *G09G 3/3225* (2013.01); *H01L 27/3246* (2013.01); *H01L 51/5237* (2013.01); *G09G 2320/02* (2013.01)

(58) Field of Classification Search
CPC ....... G09G 2300/02; G09G 2300/0426; G09G 2320/02; G09G 3/006; G09G 3/3225; H01L 27/322; H01L 27/3246; H01L 27/3276; H01L 27/3279; H01L 51/0031; H01L 51/5237
See application file for complete search history.

(56) References Cited

U.S. PATENT DOCUMENTS

| | | | |
|---|---|---|---|
| 10,312,305 B2 | 6/2019 | Kim et al. | |
| 10,312,469 B2 | 6/2019 | Park et al. | |
| 2019/0140212 A1* | 5/2019 | Park .................... | H01L 51/5253 |
| 2019/0288046 A1 | 9/2019 | Park et al. | |
| 2019/0333461 A1* | 10/2019 | Kikuchi .............. | H01L 29/7869 |

FOREIGN PATENT DOCUMENTS

| | | |
|---|---|---|
| KR | 10-2017-0113763 A | 10/2017 |
| KR | 10-2019-0014297 A | 2/2019 |
| KR | 10-1976832 B1 | 5/2019 |
| KR | 10-2019-0110170 A | 9/2019 |

* cited by examiner

*Primary Examiner* — Insa Sadio
(74) *Attorney, Agent, or Firm* — Seed IP Law Group LLP

(57) ABSTRACT

A transparent display device is disclosed, which may reduce a yellowish phenomenon in a non-display area. The transparent display device comprises a substrate provided with a display area in which a plurality of subpixels are disposed, and a non-display area adjacent to the display area, a gate driver provided in the non-display area over the substrate, including a plurality of stages, a metal line provided between the gate driver and the display area, and a trench provided between the metal line and the display area.

19 Claims, 17 Drawing Sheets

TRANSPARENT DISPLAY DEVICE

CROSS REFERENCE TO RELATED APPLICATION

This application claims priority from Korean Patent Application No. 10-2019-0177869, filed Dec. 30, 2019, which is hereby incorporated by reference for all purposes as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area. The transparent display device may have high light transmittance in the display area through the transmissive area.

BRIEF SUMMARY

The inventors of the present disclosure have recognized that the transparent display device has lower light transmittance in the non-display area than the display area as a plurality of signal lines are disposed in the non-display area. The inventors further recognized and appreciated that a yellowish phenomenon occurs in the transparent display device due to material characteristics of an insulating film provided in the non-display area, whereby light transmittance may be more lowered. The present disclosure has been made in view of the one or more problems in the related are including the above problems. Accordingly, one or more embodiments of the present disclosure provides a transparent display device that may have high light transmittance in a non-display area as well as a display area.

One or more embodiments of the present disclosure provides a transparent display device that may reduce a yellowish phenomenon in a non-display area.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a substrate provided with a display area in which a plurality of subpixels are disposed, and a non-display area adjacent to the display area, a gate driver provided in the non-display area on the substrate, including a plurality of stages, a metal line provided between the gate driver and the display area, and a trench provided between the metal line and the display area.

In accordance with another aspect of the present disclosure, the above and other benefits can be accomplished by the provision of a transparent display device comprising a substrate provided with a display area in which a plurality of subpixels are disposed, and a non-display area adjacent to the display area, a plurality of metal lines provided in the non-display area over the substrate, and at least one insulating film provided over the plurality of metal lines and provided with an open area formed between one of the metal lines and the display area.

According to the present invention, the transmissive area is provided in the non-display area provided with the gate driver, whereby transmittance in the non-display area may be improved.

Also, according to the present disclosure, a bank is not formed over the gate driver, whereby a yellowish phenomenon may be prevented from occurring due to material characteristics of the bank.

Also, according to the present disclosure, the trench is provided between the gate driver and the display area, whereby oxygen or water which is externally permeated may be prevented from being propagated through organic films.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
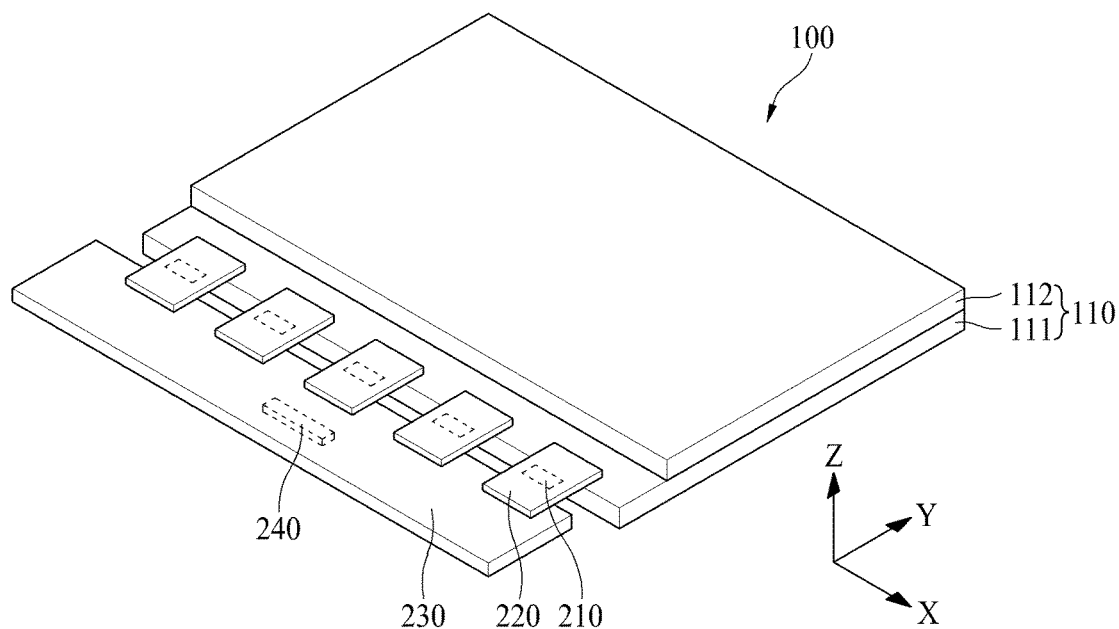
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may indirectly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device (LCD), a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The gate driver supplies gate signals to the gate lines in accordance with a gate control signal which is provided from the timing controller 240. The gate driver may be provided in the non-display area outside one side of the display area of the transparent display panel 110, or both sides of the transparent display panel 110 by a gate driver in panel (GIP) method. In another way, the gate driver may be manufactured in a driving chip, may be mounted on the flexible film, and may be attached to the non-display area outside one side of the display area of the transparent display panel 110, or both sides of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in a non-display area of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
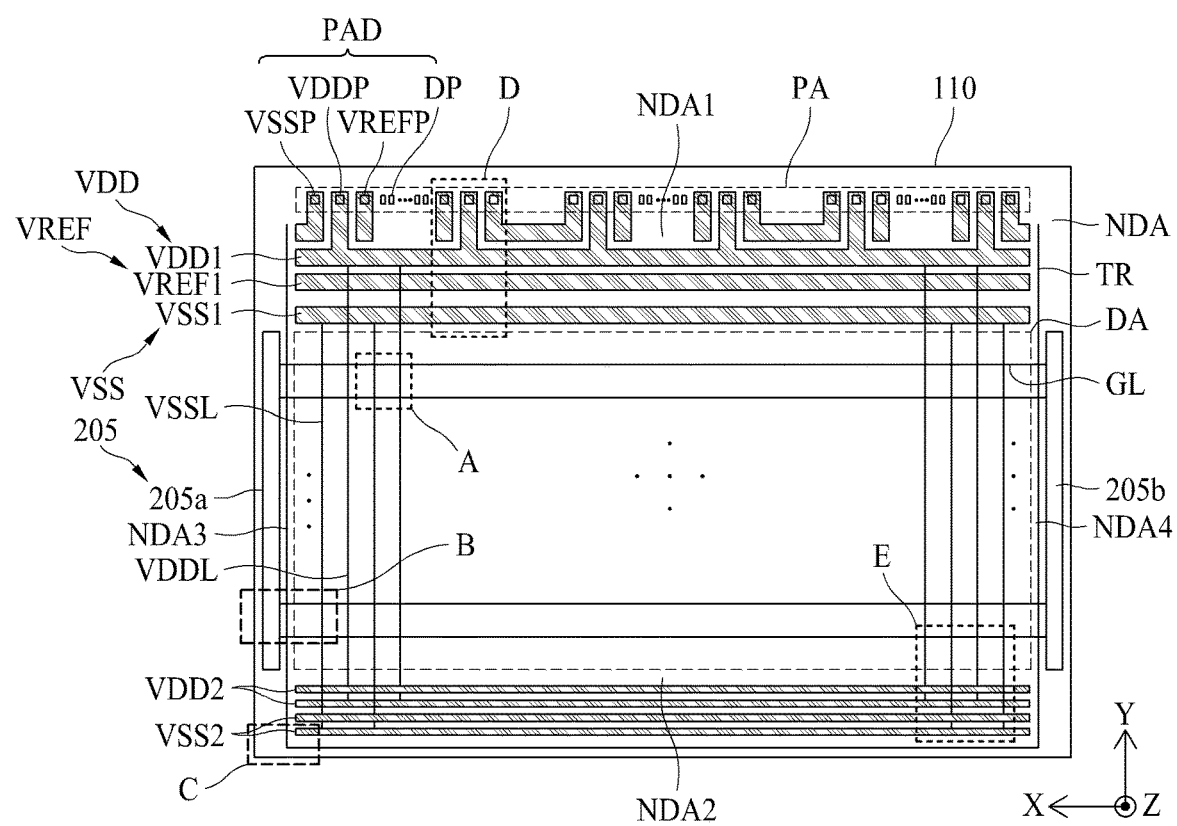
FIG. 2 is a schematic plane view illustrating a transparent display panel.
Figure 3:
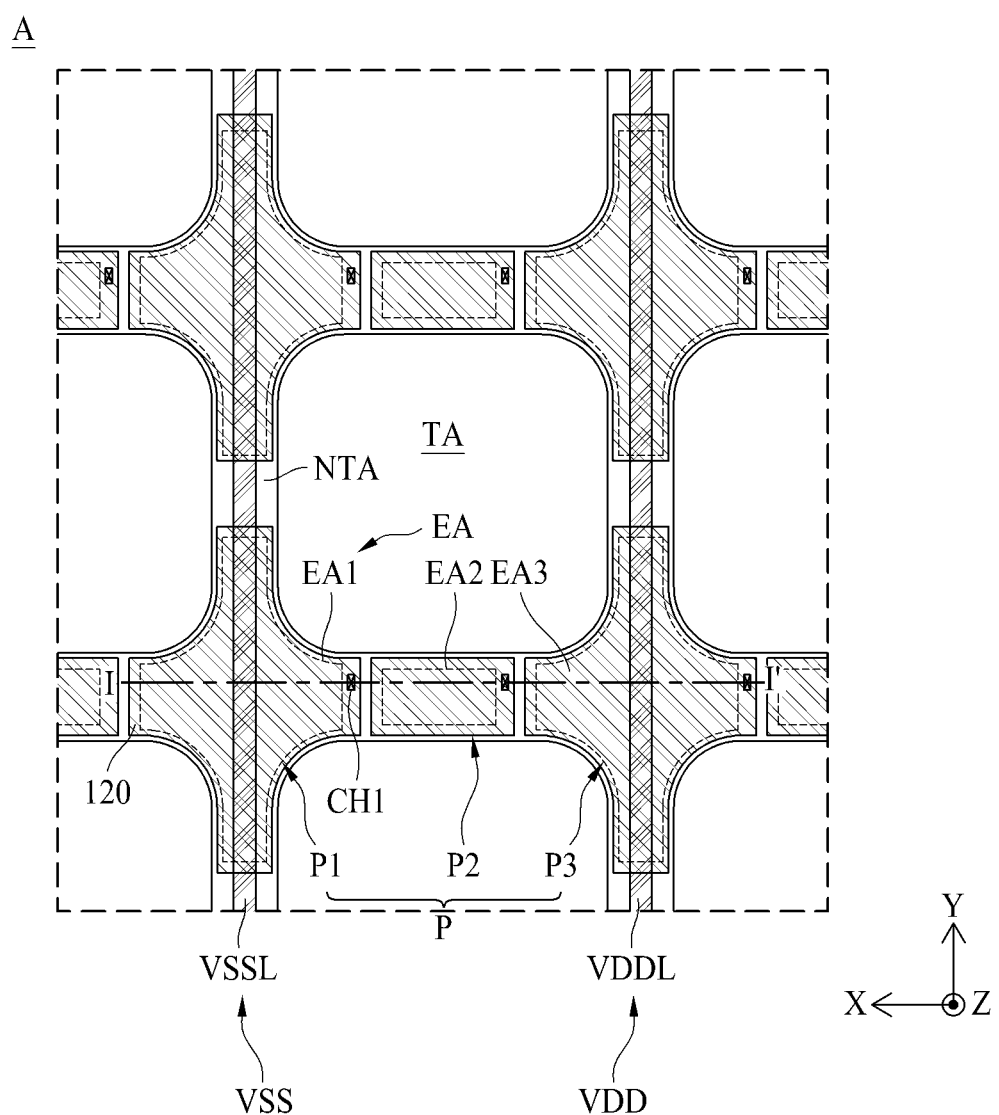
FIG. 3 is an enlarged view of an area A in FIG. 2.
Figure 4:
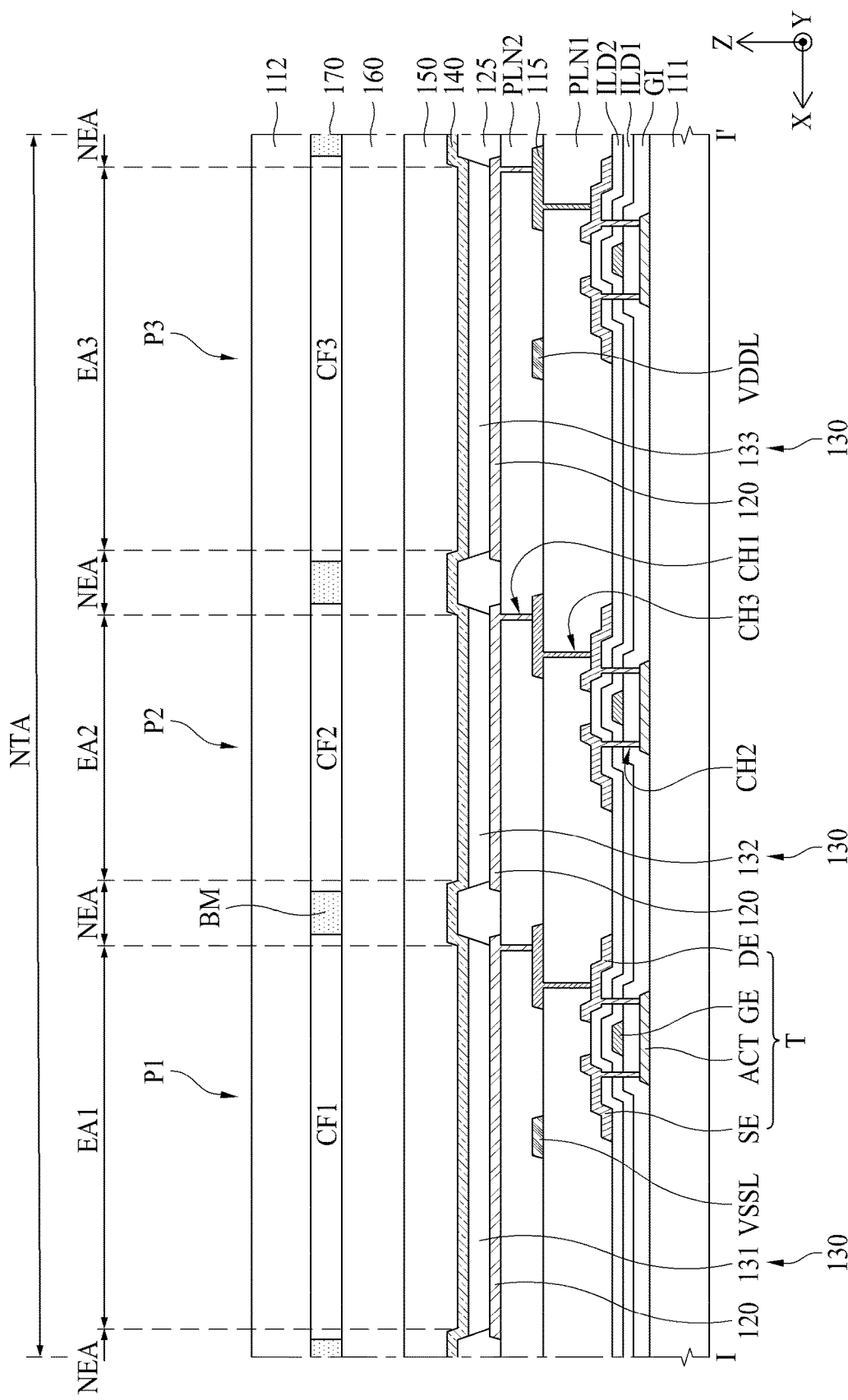
FIG. 4 is a cross-sectional view taken along line I-I' of FIG. 3.

FIG. 2 is a schematic plane view illustrating a transparent display panel, FIG. 3 is an enlarged view of an area A in FIG. 2, FIG. 4 is a cross-sectional view taken along line I-I' of FIG. 3.

The first substrate 111 may include a display area DA where pixels P are formed to display an image, and a non-display area NDA that does not display an image.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, 90%, and the non-transmissive area NTA may be an area where light transmittance is smaller than β%, for example, 50%. Here, α is greater than β. A user may view an object or background arranged behind the transparent display panel 110 due to the transmissive area TA.

The non-transmissive area NTA may be provided with pixel power lines VDD(VDDL), common power lines VSS (VSSL), reference lines, data lines, gate lines GL, and pixels P.

The gate lines GL may be extended in a first direction (e.g., X axis direction), and may cross (or overlap) the pixel power lines VDD(VDDL), the common power lines VSS (VSSL) and the data lines in the display area DA.

The pixel power lines VDD(VDDL), the common power lines VSS(VSSL), the reference lines and the data lines may be extended in a second direction (e.g., Y axis direction). Here, the pixel power lines VDD(VDDL) and the common power lines VSS(VSSL) may alternately be disposed in the display area DA. The transmissive area TA may be disposed between the pixel power line VDD(VDDL) and the common power line VSS(VSSL).

The pixels P emit predetermined light to display an image. An emission area EA may correspond to an area, from which light emits, in the pixel P.

Each of the pixels P may include a first subpixel P1, a second subpixel P2, and a third subpixel P3. The first subpixel P1 may be provided to include a first emission area EA1 emitting green light, the second subpixel P2 may be provided to include a second emission area EA2 emitting red light, and the third subpixel P3 may be provided to include a third emission area EA3 emitting blue light, but these subpixel are not limited thereto. Each of the pixels P may further include a subpixel emitting white light W. An arrangement sequence of the subpixel P1, P2 and P3 may be changed in various ways.

Hereinafter, for convenience of description, a description will be given based on that the first subpixel P1 is a green subpixel emitting green light, the second subpixel P2 is a red subpixel emitting red light, and the third subpixel P3 is a blue subpixel emitting blue light.

Each of the first subpixel P1, the second subpixel P2 and the third subpixel P3, as shown in FIG. 4, may include a circuit element that includes a capacitor, a thin film transistor, etc., and a light emitting diode. The thin film transistor may include a switching transistor, a sensing transistor, and a driving transistor T.

The switching transistor is switched in accordance with a gate signal supplied to the gate line GL and serves to supply a data voltage supplied from the data line to the driving transistor T.

The sensing transistor serves to sense a threshold voltage deviation of the driving transistor T, which is a cause of image quality degradation.

The driving transistor T is switched in accordance with the data voltage supplied from the switching transistor to generate a data current from a power source supplied from the pixel power line VDD(VDDL), and serves to supply the generated data current to the anode electrode 120 of the pixel.

The driving transistor T includes an active layer ACT, a gate electrode GE, a source electrode SE, and a drain electrode DE.

In detail, the active layer ACT may be provided over the first substrate 111. The active layer ACT may be formed of a silicon based semiconductor material or an oxide based semiconductor material. A buffer layer (not shown) may be provided between the active layer ACT and the first substrate 111.

A gate insulating layer GI may be provided over the active layer ACT. The gate insulating layer GI may be formed as an inorganic film, for example, a silicon oxide (SiOx) film, a silicon nitride (SiNx) film, or a multi-layered film of SiOx and SiNx.

A gate electrode GE may be provided over the gate insulating layer GI. The gate electrode GE may be formed of a single layer or a multi-layer made of any one of Mo, Al, Cr, Au, Ti, Ni, Nd and Cu or their alloy.

A first inter-layer insulating layer ILD1 and a second inter-layer insulating layer ILD2 may be provided over the gate electrode GE. The first inter-layer insulating layer ILD1 and the second inter-layer insulating layer ILD2 may be formed as an inorganic layer, for example, a silicon oxide (SiOx) layer, a silicon nitride (SiNx) layer, or a multi-layered layer of SiOx and SiNx.

Source and drain electrodes SE and DE may be provided over the second inter-layer insulating layer ILD2. One of the source and drain electrodes SE and DE may be connected to the active layer ACT through a second contact hole CH2 that passes through the gate insulating layer GI and the first and second inter-layer insulating layers ILD1 and ILD2.

The source and drain electrodes SE and DE may be formed of a single layer or a multi-layer made of any one of Mo, Al, Cr, Au, Ti, Ni, Nd and Cu or their alloy.

A first planarization layer PLN1 may be provided over the source and drain electrodes SE and DE to planarize a step difference caused by the driving transistor T. The first planarization layer PLN1 may be formed of an organic layer, for example, acryl resin, epoxy resin, phenolic resin, polyamide resin, polyimide resin, etc.

An anode auxiliary electrode 115 may be provided over the first planarization layer PLN1. The anode auxiliary electrode 115 may be connected to one of the source and drain electrodes SE and DE through a third contact hole CH3 that passes through the first planarization layer PLN1. For example, the anode auxiliary electrode 115 may be connected to the drain electrode DE through the third contact hole CH3 that passes through the first planarization layer PLN1.

The anode auxiliary electrode 115 may be formed of a single layer or a multi-layer made of any one of Mo, Al, Cr, Au, Ti, Ni, Nd and Cu or their alloy.

A second planarization layer PLN2 may be formed over the anode auxiliary electrode 115. The second planarization layer PLN2 may be formed of an organic layer, for example, acryl resin, epoxy resin, phenolic resin, polyamide resin, polyimide resin, etc.

Light emitting diodes, which are comprised of the anode electrode 120, an organic light emitting layer 130, and a cathode electrode 140, and a bank 125 are provided over the second planarization layer PLN2.

The anode electrode 120 may be provided for each of the subpixels P1, P2 and P3. The anode electrode 120 is not provided in the transmissive area TA.

The anode electrode 120 may be connected with the driving transistor T. In detail, the anode electrode 120 may be connected to the anode auxiliary electrode 115 through a first contact hole CH1 that passes through the second planarization layer PLN2. Since the anode auxiliary electrode 115 is connected to the source electrode SE or the drain electrode DE of the driving transistor T through the third contact hole CH3, the anode electrode 120 may electrically be connected with the driving transistor T.

The anode electrode 120 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

A bank 125 may be provided over a second planarization layer PLN2. Also, the bank 125 may be formed to cover each edge of the anode electrode 120 and partially expose the anode electrode 120. Therefore, the bank 125 may prevent light emitting efficiency from being deteriorated due to a current concentrated on the ends of anode electrode 120.

In some embodiments, the bank 125 may respectively define emission areas EA1, EA2, and EA3 of the subpixels P1, P2 and P3. Each of the emission areas EA1, EA2 and EA3 of the subpixels P1, P2 and P3 indicates an area where the anode electrode 120, the organic light emitting layer 130 and the cathode electrode 140 are sequentially deposited and then holes from the anode electrode 120 and electrons from the cathode electrode 140 are combined with each other in the organic light emitting layer 130 to emit light. In this case, the area where the bank 125 is not formed and the anode electrode 120 is exposed may be an emission area EA, and the other area may be a non-emission area NEA.

The bank 125 may be formed of an organic layer, for example, acryl resin, epoxy resin, phenolic resin, polyamide resin, polyimide resin, etc.

The organic light emitting layer 130 may be on the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

The organic light emitting layer 130, as shown in FIG. 4, may include light emitting layers each of which is formed for each of the subpixels P1, P2 and P3. For example, a green light emitting layer 131 emitting green light may be formed in the first subpixel P1, a red light emitting layer 132 emitting red light may be formed in the second subpixel P2, and a blue light emitting layer 133 emitting blue light may be formed in the third subpixel P3. In this case, the light emitting layers of the organic light emitting layer 130 are not formed in the transmissive area TA.

The cathode electrode 140 may be on the organic light emitting layer 130 and the bank 125. The cathode electrode 140 may be provided in the transmissive area TA as well as the non-transmissive area NTA that includes the emission area EA, but is not limited thereto. The cathode electrode 140 may be provided in only the non-transmissive area NTA that includes the emission area EA, and may not be provided in the transmissive area TA to improve transmittance.

The cathode electrode 140 may be a common layer commonly formed for the subpixels P1, P2 and P3 to apply the same voltage to the subpixels P1, P2 and P3. The cathode electrode 140 may be formed of a transparent conductive material (TCO) such as ITO and IZO, which can transmit light, or may be formed of a semi-transmissive conductive material such as Mg, Ag, or alloy of Mg and Ag. If the cathode electrode 140 is formed of a semi-transmissive conductive material, emission efficiency may be enhanced by micro cavity.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic film and at least one organic film.

Meanwhile, although not shown in FIG. 4, a capping layer may additionally be formed between the cathode electrode 140 and the encapsulation layer 150.

A color filter layer 170 may be on the encapsulation layer 150. The color filter layer 170 may be on one surface of the second substrate 112 that faces the first substrate 111. In this case, the first substrate 111 provided with the encapsulation layer 150 and the second substrate 112 provided with the color filter layer 170 may be bonded to each other by an adhesive layer 160. Here, the adhesive layer 160 may be an optically clear resin (OCR) layer or an optically clear adhesive (OCA) film.

The color filter layer 170 may be formed to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

The transparent display panel 110 according to one embodiment of the present disclosure is characterized in that a polarizer is not used, and the color filter layer 170 is formed in the second substrate 112. If the polarizer is attached to the transparent display panel 110, transmittance of the transparent display panel 110 is reduced by the polarizer. Meanwhile, if the polarizer is not attached to the transparent display panel 110, a problem occurs in that externally incident light is reflected towards the electrodes.

Since a polarizer is not attached to the transparent display panel 110 according to one embodiment of the present disclosure, transmittance may be prevented from being reduced. Also, in the transparent display panel 110 according to one embodiment of the present disclosure, the color filter layer 170 may be formed in the second substrate 112 to partially absorb externally incident light, thereby preventing the incident light from being reflected toward the electrodes. That is, the transparent display panel 110 according to one embodiment of the present disclosure may reduce external light reflectivity without reducing transmittance.

Meanwhile, a black matrix BM may be provided among the color filters CF1, CF2 and CF3. The black matrix BM may be provided among the subpixels P1, P2 and P3 to prevent color mixture among the adjacent subpixels P1, P2 and P3 from occurring. Also, the black matrix BM may prevent externally incident light from being reflected toward a plurality of lines provided among the subpixels P1, P2 and P3, for example, the gate lines, the data lines, the pixel power lines, the common power lines, the reference lines, etc.

The black matrix BM may include a material that absorbs light, for example, a black dye that absorbs light of a visible light wavelength range.

In some embodiments, the color filter layer 170 may define a non-transmissive area NTA in the display area DA. In detail, the area where the color filters CF1, CF2 and CF3 and the black matrix BM is provided may be the non-transmissive area NTA, and the other area may be the transmissive area TA.

Referring to FIG. 2 again, the non-display area NDA may include a pad area PA on which pads PAD are disposed, at least one gate driver 205, and a trench TR.

In detail, the non-display area NDA may include a first non-display area NDA1 in which pads PAD are disposed, a second non-display area NDA2 disposed in parallel with the first non-display area NDA1 by interposing the display area DA, and third and fourth non-display areas NDA3 and NDA4 connecting the first non-display area NDA1 with the second non-display area NDA2.

The gate driver 205 are connected to the gate lines GL and supplies gate signals to the gate lines GL. The gate driver 205 may be disposed in at least one of the third non-display area NDA3 and the fourth non-display area NDA4 in a gate driver in panel (GIP) type. For example, as shown in FIG. 2, the gate driver 205 may be formed in the third non-display area NDA3, and another gate driver 205 may be formed in the fourth non-display area NDA4, but these gate drivers are not limited thereto. The gate driver 205 may be formed only in any one of the third non-display area NDA3 and the fourth non-display area NDA4.

The trench TR may be provided in the non-display area NDA. In detail, the trench TR may be provided in at least one of the first non-display area NDA1, the second non-display area NDA2, the third non-display area NDA3 and the fourth non-display area NDA4.

For example, the trench TR may be provided in the second non-display area NDA2, the third non-display area NDA3 and the fourth non-display area NDA4. A plurality of signal lines may be disposed in the first non-display area NDA1, and connection electrodes connecting the plurality of signal lines may be disposed therein. For this reason, it may not be easy that the trench TR is formed in the first non-display area NDA1 by partially removing the insulating films provided between the plurality of signal lines and the connection electrodes.

Meanwhile, the trenches TR provided in the second non-display area NDA2, the third non-display area NDA3 and the fourth non-display area NDA4, as shown in FIG. 2, may be connected with one another, but are not limited thereto. The trenches TR provided in the second non-display area NDA2, the third non-display area NDA3 and the fourth non-display area NDA4 may be disconnected without being connected.

Hereinafter, the gate driver 205 and the trench TR, which are provided in the third non-display area NDA3, will be described in more detail with reference to FIGS. 5 to 11.

Figure 5:
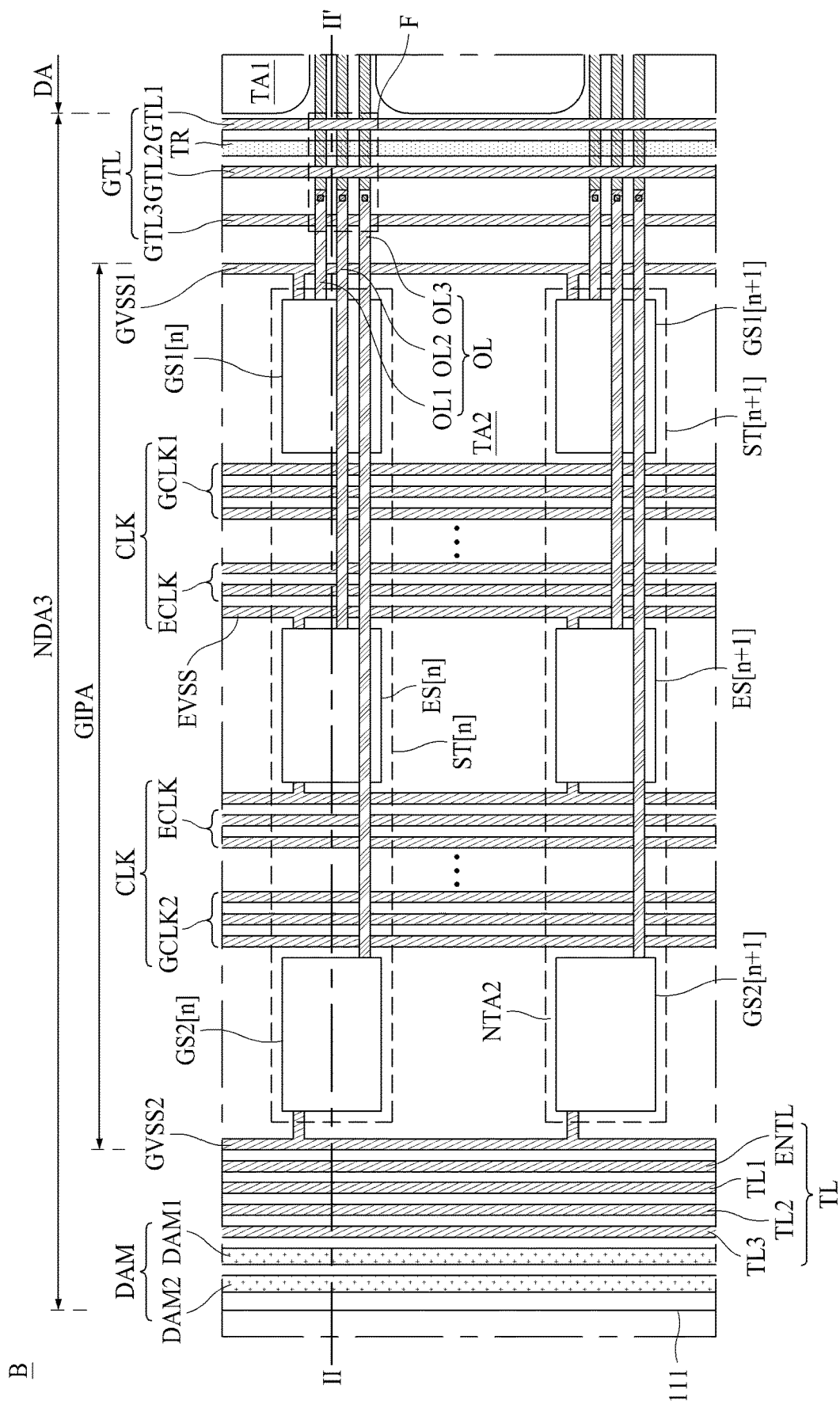
FIG. 5 is an enlarged view of an area B in FIG. 2.
Figure 6:
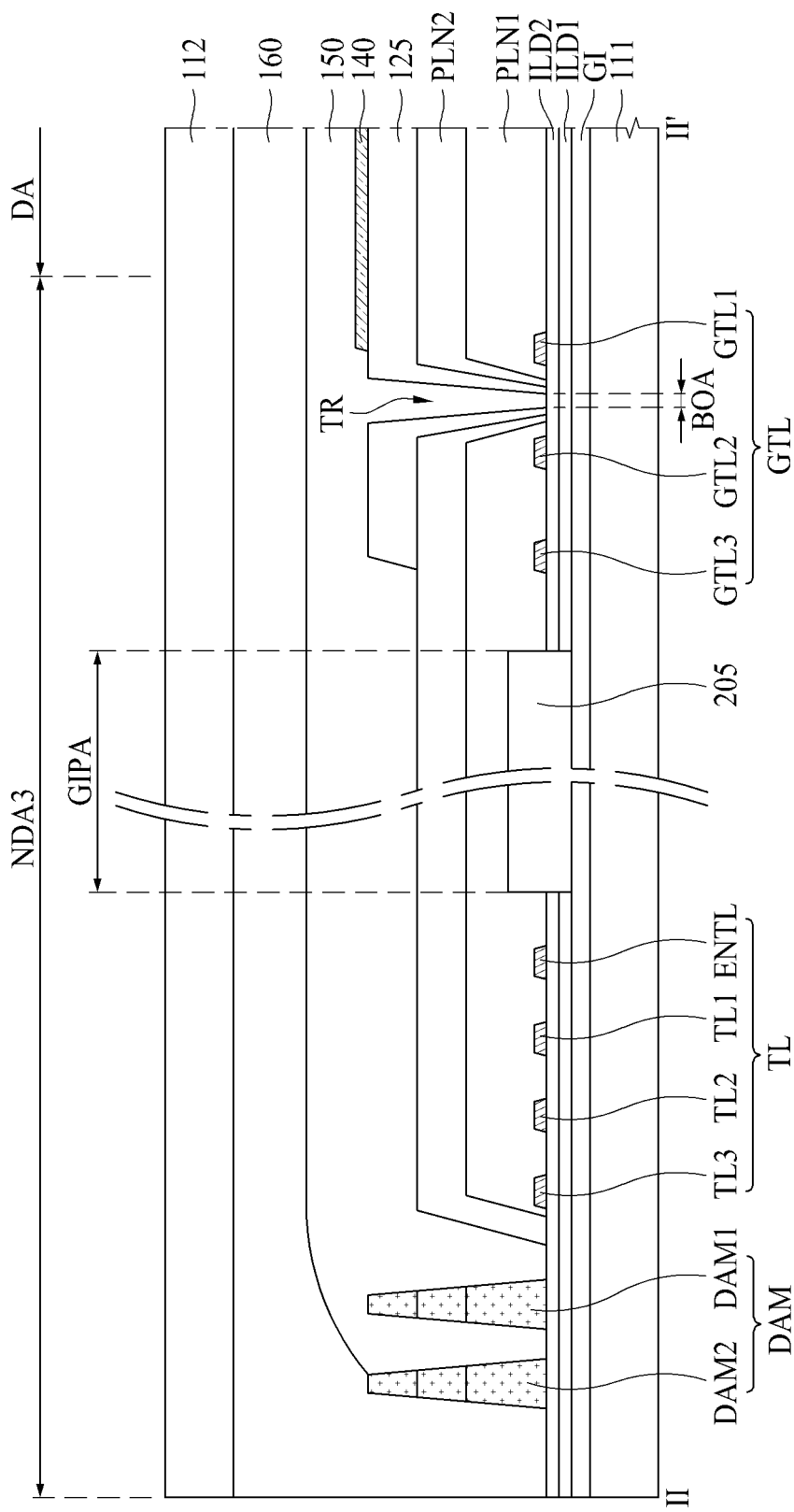
FIG. 6 is a cross-sectional view taken along line II-II' of FIG. 5.
Figure 7:
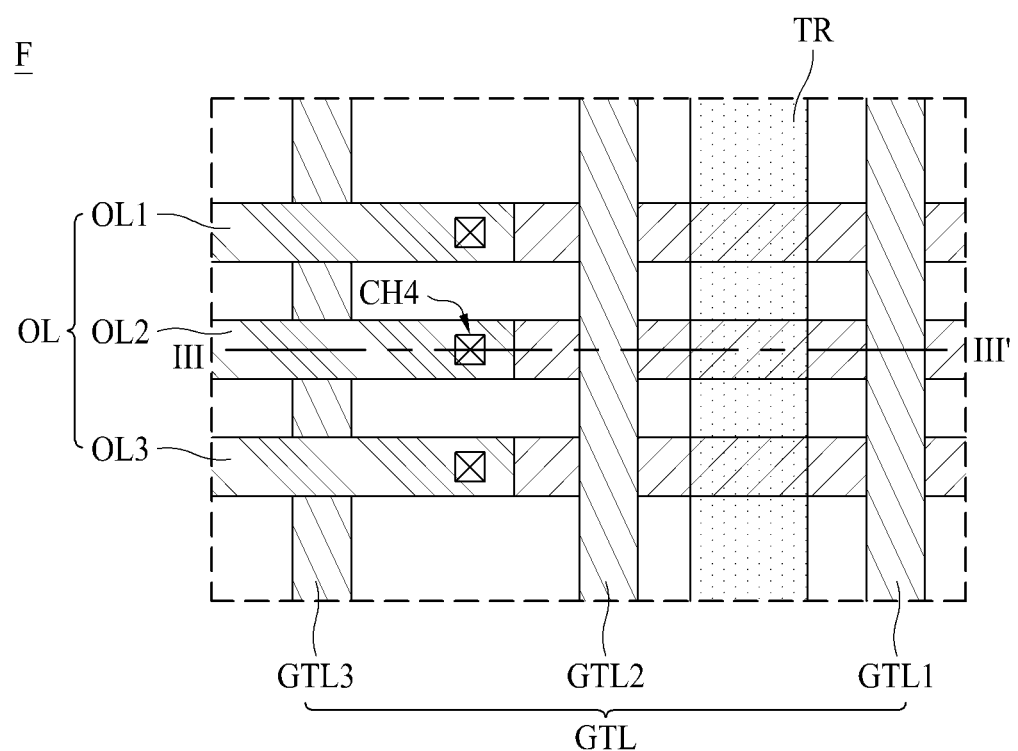
FIG. 7 is an enlarged view of an area F in FIG. 5.
Figure 8:
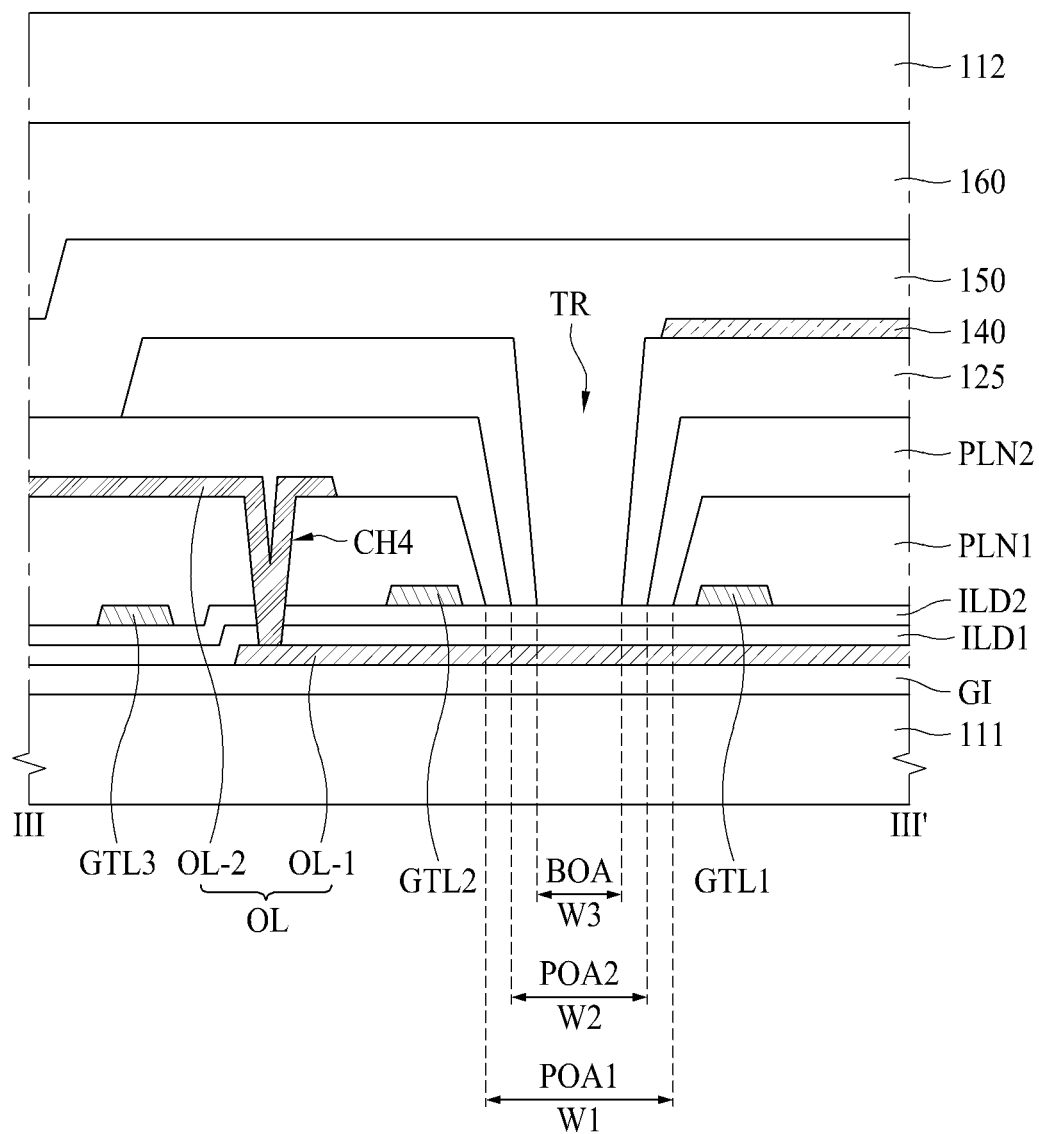
FIG. 8 is a cross-sectional view taken along line III-III' of FIG. 7.

FIG. 5 is an enlarged view of an area B in FIG. 2, FIG. 6 is a cross-sectional view taken along line II-II' of FIG. 5, FIG. 7 is an enlarged view of an area F in FIG. 5, and FIG. 8 is a cross-sectional view taken along line III-III' of FIG. 7.

Referring to FIGS. 5 to 8, the gate driver 205, the trench TR, a plurality of output test lines GTL, a plurality of lighting test lines TL and a dam may be provided in the third non-display area NDA3.

The gate driver 205 may include a first gate driver 205a disposed in the third non-display area NDA3 and a second gate driver 205b disposed in the fourth non-display area NDA4. The first gate driver 205a provided in the third non-display area NDA3 will be described with reference to FIGS. 5 to 8. Since the second gate driver 205b disposed in the fourth non-display area NDA4 is substantially the same as the first gate driver 205a provided in the third non-display area NDA3, its detailed description will be omitted.

Each of the first and second gate drivers 205a and 205b may include a plurality of stages ST. Each of the plurality of stages ST may include a plurality of circuits.

For example, each of the first and second gate drivers 205a and 205b may include a plurality of stages ST for outputting a first gate signal, a light emission signal, and a second gate signal. In this case, each of the plurality of stages ST, as shown in FIG. 5, may include a first gate signal generating circuit GS1, a light emission signal generating circuit ES, and a second gate signal generating circuit GS2.

The first gate signal generating circuit GS1 may be a circuit for generating the first gate signal used to turn on or turn off switching transistors included in the subpixels P1, P2 and P3. In detail, a first gate start signal may be input from a first gate start signal line or a previous stage to the first gate signal generating circuit GS1. The first gate signal generating circuits GS1 included in the plurality of stages ST may sequentially operate in accordance with the first gate start signal input from the first gate start signal line or the previous stage.

If the first gate start signal is input, the first gate signal generating circuit GS1 may generate a first gate clock signal supplied from any one of a plurality of first gate clock signal lines GCLK1 as the first gate signal, and may output the first gate signal through a first signal output line OL1.

The light emission signal generating circuit ES may be a circuit for generating light emission signal used to turn on or turn off a light emission control transistor included in the subpixels P1, P2 and P3. In detail, a light emission start signal may be input from a light emission start signal line or a previous stage to the light emission signal generating circuit ES. The light emission signal generating circuits ES included in the plurality of stages ST may sequentially operate in accordance with the light emission start signal input from the light emission start signal line or the previous stage.

If the light emission start signal is input, the light emission signal generating circuit ES may generate a light emission clock signal supplied from any one of a plurality of light emission clock signal lines ECLK as the light emission control signal, and may output the light emission control signal through a second signal output line OL2.

The second gate signal generating circuit GS2 may be a circuit for generating the second gate signal used to turn on or turn off switching transistors included in the subpixels P1, P2 and P3. In detail, a second gate start signal may be input from a second gate start signal line or a previous stage to the second gate signal generating circuit GS2. The second gate signal generating circuits GS2 included in the plurality of stages ST may sequentially operate in accordance with the second gate start signal input from the second gate start signal line or the previous stage.

If the second gate start signal is input, the second gate signal generating circuit GS2 may generate a second gate clock signal supplied from any one of a plurality of second gate clock signal lines GCLK2 as the second gate signal, and may output the second gate signal through a third signal output line OL3.

The transparent display panel 110 according to one embodiment of the present disclosure may include a transmissive area provided in a gate driving area GIPA where the first and second gate drivers 205a and 205b are formed.

The gate driving area GIPA may include a second transmissive area TA2 that transmits most of externally incident light, and a second non-transmissive area NTA2 that fails to transmit most of externally incident light. In detail, the plurality of stages ST may be disposed to be spaced apart from one another in a second direction (Y axis direction). The first gate signal generating circuit GS1, the light emission signal generating circuit ES and the second gate signal generating circuit GS2, which are included in one stage ST, may be disposed to be spaced apart from one another in a first direction (X axis direction).

Meanwhile, the plurality of first gate clock signal lines GCLK1 and the plurality of light emission clock signal lines ECLK may be disposed between the first gate signal generating circuit GS1 and the light emission signal generating circuit ES provided in each of the plurality of stages ST. A first low potential voltage line GVSS1 for supplying a low potential voltage to the first gate signal generating circuit GS1 may further be disposed between the first gate signal generating circuit GS1 and the light emission signal generating circuit ES provided in each of the plurality of stages ST, but is not limited thereto. The first low potential voltage line GVSS1, as shown in FIG. 5, may be disposed between the first gate signal generating circuit GS1 and the display area DA. Here, the plurality of first gate clock signal lines GCLK1, the plurality of light emission clock signal lines ECLK and the first low potential voltage line GVSS1 may be extended in a second direction (Y axis direction).

The plurality of light emission clock signal lines ECLK and the plurality of second clock signal lines GCLK2 may be disposed between the light emission signal generating circuit ES and the second gate signal generating circuit GS2 provided in each of the plurality of stages ST. At least one of a second low potential voltage line EVSS for supplying a low potential voltage to the light emission signal generating circuit ES and a third low potential voltage line GVSS2 for supplying a low potential voltage to the second gate signal generating circuit GS2 may be disposed between the light emission signal generating circuit ES and the second gate signal generating circuit GS2 provided in each of the plurality of stages ST, but is not limited thereto. The second low potential voltage line EVSS may be disposed between the first gate signal generating circuit GS1 and the light emission signal generating circuit ES, as shown in FIG. 5. Alternatively, the second low potential voltage line EVSS may be disposed outside the second gate signal generating circuit GS2. Here, the plurality of light emission clock signal lines ECLK, the plurality of second gate clock signal lines GCLK2, the second low potential voltage line EVSS and the third low potential voltage line GVSS2 may be extended in a second direction (Y axis direction).

The second transmissive area TA2 provided in the gate driving area GIPA may be disposed among the plurality of stages ST, and the second non-transmissive area NTA2 may be disposed with the plurality of stages ST. Also, the second transmissive area TA2 may be disposed among the plurality of clock signal lines CLK. For example, in the transparent display panel 110 according to one embodiment of the present disclosure, as shown in FIG. 5, the second transmissive area TA2 may be formed with a large sized area between a light emission control signal generating circuit ES[n] provided in one stage ST[n] and a light emission control signal generating circuit ES[n+1] provided in another one stage ST[n+1] and between the second low potential voltage line EVSS and the light emission clock signal line ECLK.

In the transparent display panel 110 according to one embodiment of the present disclosure, the common power line VSS and the pixel power line VDD may be provided in only the first non-display area NDA1 and the second non-display area NDA2 of the non-display area NDA. In the transparent display panel of the related art, the common power line VSS and the pixel power line VDD may be provided to surround the display area DA, whereby the non-display area NDA has low transmittance. Particularly, in the transparent display panel of the related art, the gate driver 205, the common power line VSS and the pixel power line VDD are overlapped with one another in the area where the gate driver 205 is provided, whereby transmittance is more lowered.

In the transparent display panel 110 according to one embodiment of the present disclosure, the common power line VSS and the pixel power line VDD may not be formed in the third and fourth non-display areas NDA3 and NDA4 where the gate driver 205 is provided. Therefore, in the transparent display panel 110 according to one embodiment of the present disclosure, the second transmissive area TA2 may be provided among the plurality of stages ST and among the plurality of clock signal lines CLK. Here, the second transmissive area TA2 may have the same transmittance as that of the first transmissive area TA1 provided in the display area DA. As a result, in the transparent display panel 110 according to one embodiment of the present disclosure, transmittance in the non-display area NDA may be improved.

In the transparent display panel 110 according to one embodiment of the present disclosure, as shown in FIG. 5, one or more metal lines may be provided between the gate driving area GIPA and the display area DA, and the trench TR may be provided between the gate driving area GIPA and the display area DA. The one or more metal lines may be referred to herein after as "the metal line." The use of singular form for "the metal line" does not necessarily mean that it includes only one metal line. In some embodiments, it may include more than one metal lines.

For example, the metal line disposed between the gate driving area GIPA and the display area DA may be an output test line GTL, but is not limited thereto. Hereinafter, as a description of one embodiment according to the present disclosure, the following description will be given based on that the metal line provided between the gate driving area GIPA and the display area DA is an output test line GTL. In other embodiments, the metal line may indicate other conductive lines other than the output test line GTL. Further, if it is conductive, it does not necessarily have to be limited to a metal line.

The output test line GTL may be a line for testing whether a signal, for example, a gate signal or a light emission control signal is normally output from the gate driver 205. The output test line GTL may be disposed between the gate driver 205 and the display area DA. The output test line GTL may be extended in a second direction (Y axis direction) and connected with the gate driver 205 at one end and connected to a test pad at the other end.

The output test line GTL may be provided in a plural number. For example, the output test line GTL, as shown in FIG. 5, may include a first output test line GTL1, a second output test line GTL2, and a third output test line GTL3. The first output test line GTL1, the second output test line GTL2 and the third output test line GTL3 may be extended in a second direction (Y axis direction) between the gate driver 205 and the display area DA. The first output test line GTL1, the second output test line GTL2 and the third output test line GTL3 may be spaced apart from one another.

The first output test line GTL1 may be connected with the first gate signal generating circuit GS1 of the gate driver 205. Here, the first output test line GTL1 may be connected with the first gate signal generating circuit GS1 included in the stage ST finally disposed among the plurality of stages ST.

The second output test line GTL2 may be connected with the light emission signal generating circuit ES of the gate driver 205. Here, the second output test line GTL2 may be connected with the light emission signal generating circuit ES included in the stage ST finally disposed among the plurality of stages ST.

The third output test line GTL3 may be connected with the second gate signal generating circuit GS2 of the gate driver 205. Here, the third output test line GTL3 may be connected with the second gate signal generating circuit GS2 included in the stage ST finally disposed among the plurality of stages ST.

The output test line GTL may be provided on the same layer as the source electrode SE and the drain electrode DE of the driving transistor T provided in the display area DA. The output test line GTL may be made of the same material as that of the source electrode SE and the drain electrode DE of the driving transistor T and may be formed simultaneously with them.

The trench TR may be provided between the gate driver 205 and the display area DA in the third non-display area NDA3 and the fourth non-display area NDA4. In more detail, the trench TR may be provided between the display area DA and one of the plurality of output test lines GTL provided between the gate driver 205 and the display area DA.

The trench TR may be formed in at least one insulating film provided over the output test line GTL. In detail, at least one insulating film provided over the output test line GTL may include at least one of the first planarization film PLN1, the second planarization film PLN2 and the bank 125, which are formed to be extended from the display area DA.

The first planarization film PLN1, the second planarization film PLN2 and the bank 125 may be formed over the output test line GTL as shown in FIGS. 6 and 8, but are not limited thereto.

The trench TR may be formed in the first planarization film PLN1, the second planarization film PLN2 and the bank 125. The trench TR may be formed to pass through the first planarization film PLN1, the second planarization film PLN2 and the bank 125.

In detail, the first planarization film PLN1 may include a first open area POA1 that exposes the layer therebelow, for example, the second inter-layer insulating layer ILD2 by passing through the corresponding layer from an upper surface to a lower surface at a first width W1. Here, the first width W1 of the first open area POA1 may be narrower than a spaced distance between the output test lines GTL. For example, the first width W1 of the first open area POA1, as shown in FIG. 8, may be shorter than a distance between the first output test line GTL1 and the second output test line GTL2. Therefore, the first planarization film PLN1 may overlay the output test lines GTL without exposing them.

The second planarization film PLN2 may include a second open area POA2 that exposes the layer therebelow, for example, the second inter-layer insulating layer ILD2 by passing through the corresponding layer from an upper surface to a lower surface at a second width W2. Here, the second width W2 may be narrower than the first width W1, and the second open area POA2 may be disposed in the first open area POA1. That is, the second planarization film PLN2 may overlay the side of the first planarization film PLN1 exposed from the first open area POA1.

The bank 125 may include a third open area BOA that exposes the layer therebelow, for example, the second inter-layer insulating layer ILD2 by passing through the corresponding layer from an upper surface to a lower surface at a third width W3. Here, the third width W3 may be narrower than the second width W2, and the third open area BOA may be disposed in the second open area POA2. That is, the bank 125 may overlay the second inter-layer insulating layer ILD2 exposed from the second open area POA2.

Consequently, the trench TR may be formed to pass through the first planarization film PLN1, the second planarization film PLN2 and the bank 125, and may correspond to a groove provided in the third open area BOA.

In the transparent display panel 110 according to one embodiment of the present disclosure, the trench TR may be formed in an organic insulating film vulnerable to oxygen or water. The transparent display panel 110 according to one embodiment of the present disclosure may prevent externally permeated oxygen or water from being propagated along the first planarization film PLN1, the second planarization film PLN2 or the bank 125. Therefore, the transparent display panel 110 according to one embodiment of the present disclosure may prevent the metal lines from being corroded.

The bank 125 according to one embodiment of the present disclosure may be formed in the trench TR to overlay the sides of the second planarization film PLN2.

The trench TR may expose a boundary surface between the first planarization film PLN1 and the second planarization film PLN2 and a boundary surface between the second planarization film PLN2 and the bank 125 in accordance with a process method. Since the externally permeated oxygen or water is more quickly propagated along the boundary surface between the layers, oxygen or water may quickly be permeated along the exposed surface between the first planarization film PLN1 and the second planarization film PLN2 and the exposed surface between the second planarization film PLN2 and the bank 125.

In the transparent display panel 110 according to one embodiment of the present disclosure, the bank 125 may be formed in the trench TR to overlay the boundary surface between the first planarization film PLN1 and the second planarization film PLN2 and the boundary surface between the second planarization film PLN2 and the bank 125, whereby oxygen or water may be prevented from being quickly propagated.

Although FIGS. 6 and 8 show that the trench TR passes through (or extends through) all of the first planarization film PLN1, the second planarization film PLN2 and the bank 125, the present disclosure is not limited to the examples of FIGS. 6 and 8. The trench TR may be formed to pass through only the first planarization film PLN1 and the second planarization film PLN2.

In detail, the gate driver 205 may be made of metal lines formed on the same layer as each of the gate electrode GT, the source electrode SE, the drain electrode DE and the anode auxiliary electrode 115 of the driving transistor T provided in the display area DA. Therefore, in some embodiments, it is beneficial to provide the first planarization film PLN1 and the second planarization film PLN2 in the gate driver 205.

On the other hand, as described above, in the transparent display panel 110 according to one embodiment of the present disclosure, the common power line VSS and the pixel power line VDD are not provided in the third non-display area NDA3 and the fourth non-display area NDA4. Therefore, the metal line may not need to be formed over the second planarization film PLN2 in the third non-display area NDA3 and the fourth non-display area NDA4.

Consequently, the bank 125 does not need to be provided in the third non-display area NDA3 and the fourth non-display area NDA4. Ends of the bank 125 have only to be disposed between the gate driver 205 and the display area DA considering a design margin, and do not need to be necessarily provided between the gate driver 205 and the trench TR.

Therefore, the bank 125 may be provided at ends of the trench TR. In this case, the bank 125 is provided at one side of the trench TR but is not provided at the other side of the trench TR, and the second planarization film PLN2 may be exposed at the other side of the trench TR.

In the transparent display panel 110 according to one embodiment of the present disclosure, the ends of the bank 125 are provided between the gate driver 205 and the display area DA, whereby the bank 125 may not be provided in the gate driver 205. The bank 125 may have a yellowish color due to material characteristic. In the transparent display panel 110 according to one embodiment of the present disclosure, the bank 125 is not formed in the gate driving area GIPA and its ends are formed between the gate driver 205 and the display area DA, whereby a yellowish phenomenon may be prevented from occurring in the gate driving area GIPA. Moreover, in the transparent display panel 110 according to one embodiment of the present disclosure, transmittance of the third non-display area NDA3 and the fourth non-display area NDA4 may be improved.

Meanwhile, in the transparent display panel 110 according to one embodiment of the present disclosure, a first signal output line OL1, a second signal output line OL2 and a third signal output line OL3 of the gate driver 205 may not be extended to the display area DA due to the trench TR by one layer but be extended to the display area DA by a plurality of layers.

In detail, the first signal output line OL1, the second signal output line OL2 and the third signal output line OL3 may be extended from the gate driver 205 to the display area DA in a first direction (X axis direction). The first signal output line OL1 may be extended from the first gate signal generating circuit GS1 to the display area DA in the first direction (X axis direction). The second signal output line OL2 may be extended from the light emission signal generating circuit ES to the display area DA in the first direction (X axis direction). The third signal output line OL3 may be extended from the second gate signal generating circuit GS2 to the display area DA in the first direction (X axis direction).

These signal output lines OL, as shown in FIGS. 7 and 8, may include a first metal layer OL-1 and a second metal layer OL-2 provided over the first metal layer OL-1. The second metal layer OL-2 of the signal output line OL may be provided between the gate driver 205 and the trench TR.

Here, the second metal layer OL-2 of the signal output line OL may be provided on the same layer as the anode auxiliary electrode 115 provided in the display area DA. The second metal layer OL-2 may be formed of the same material as that of the anode auxiliary electrode 115 simultaneously with the anode auxiliary electrode 115. In this case, the second metal layer OL-2 of the signal output line OL cannot be extended to the display area DA by the trench TR, and it is beneficial that the second metal layer OL-2 be connected to the first metal layer OL-1 of the signal output line OL between the gate driver 205 and the trench TR through a fourth contact hole CH4.

The first metal layer OL-1 of the signal output line OL may be connected to the second metal layer OL-2 of the signal output line OL between the gate driver 205 and the trench TR and extended to the display area DA.

The first metal layer OL-1 of the signal output line OL may be provided on the same layer as the gate electrode GE of the driving transistor T provided in the display area DA. The first metal layer OL-1 may be formed of the same material as that of the gate electrode GE of the driving transistor T.

The plurality of lighting test lines TL may be lines for testing whether disconnection and defect exist in the plurality of signal lines formed over the first substrate 111. These lighting test lines TL may be disposed at an outer edge the gate driver 205 in the third non-display area NDA3. The lighting test lines TL will be described in more detail with reference to FIGS. 9 to 11.

The dam DAM may be formed to at least partially surround the other edge of the display area DA, thereby blocking a flow of an organic film that constitutes the encapsulation film 150. The dam DAM may be disposed between the display area DA and the pad area PA to block a flow of the organic film such that the organic film constituting the encapsulation film 150 fails to be permeated into the pad area PA. As a result, the dam DAM may prevent the organic film from being exposed to the outside of the transparent display device 100 or from being permeated into the pad area PA.

The dam DAM may include a first dam DAM1 and a second dam DAM2. The first dam DAM1 may be formed to at least partially surround the outer edge of the display area DA to primarily block the flow of the organic film constituting the encapsulation film 150. The first dam DAM1 may be disposed at an outer edge of the plurality of signal lines. For example, the first dam DAM1 may be disposed to be spaced apart from the lighting test line disposed at the outermost edge of the plurality of lighting test lines TL. Accordingly, in some embodiments, the first dam DAM1 is formed to be spaced apart from elements such as the first planarization film PLN1 and the second planarization film PLN2 made of an organic material vulnerable to an external environment.

The second dam DAM2 may be disposed at an outer edge of the first dam DAM1 to secondarily block the organic film constituting the encapsulation film 150 overflowing to the outer edge of the first dam DAM1. As a result, the first dam DAM1 and the second dam DAM2 may more effectively block the organic film from being exposed to the outside of the transparent display device 100 or from being permeated into the pad area PA.

The first dam DAM1 and the second dam DAM2 may be formed of a single layer, or may be formed of plurality of layers as shown in FIG. 6. For example, the first dam DAM1 and the second dam DAM2 may be formed of, but not limited to, a lower layer, a middle layer and an upper layer. Here, each of the lower layer, the middle layer and the upper layer may be formed simultaneously with any one of the first planarization layer PLN1, the second planarization layer PLN2 and the bank 125, which are formed in the display area DA. The lower layer may be formed of the same material as that of the first planarization layer PLN1 simultaneously with the first planarization layer PLN1. The middle layer may be formed of the same material as that of the second planarization layer PLN2 simultaneously with the second planarization layer PLN2. The upper layer may be formed of the same material as that of the bank 125 simultaneously with the bank 125.

Figure 9:
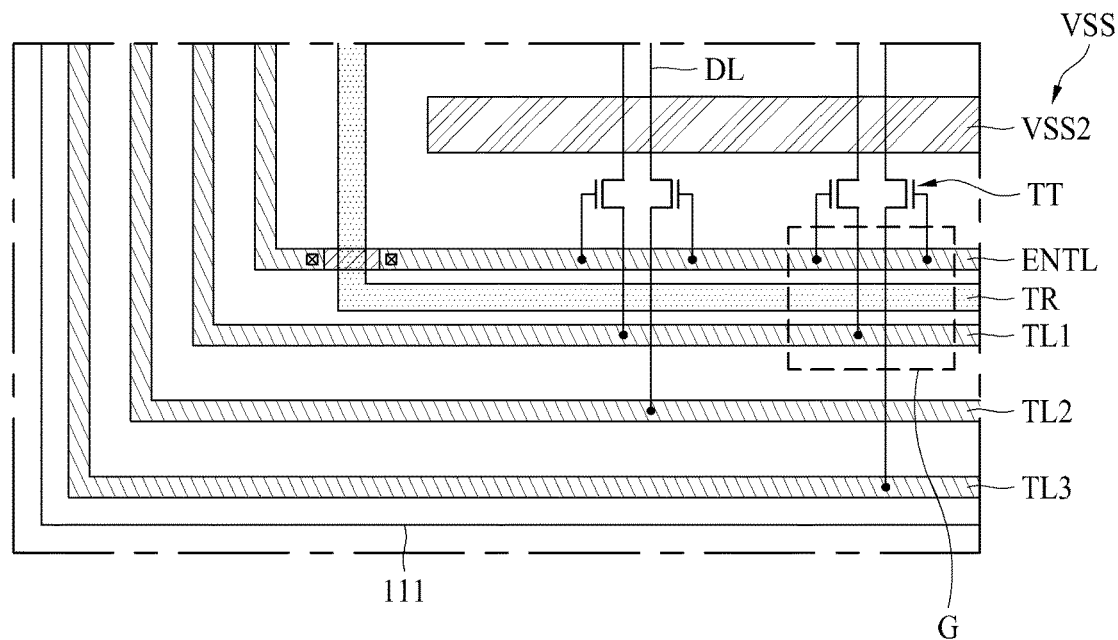
FIG. 9 is an enlarged view of an area C in FIG. 2.
Figure 10:
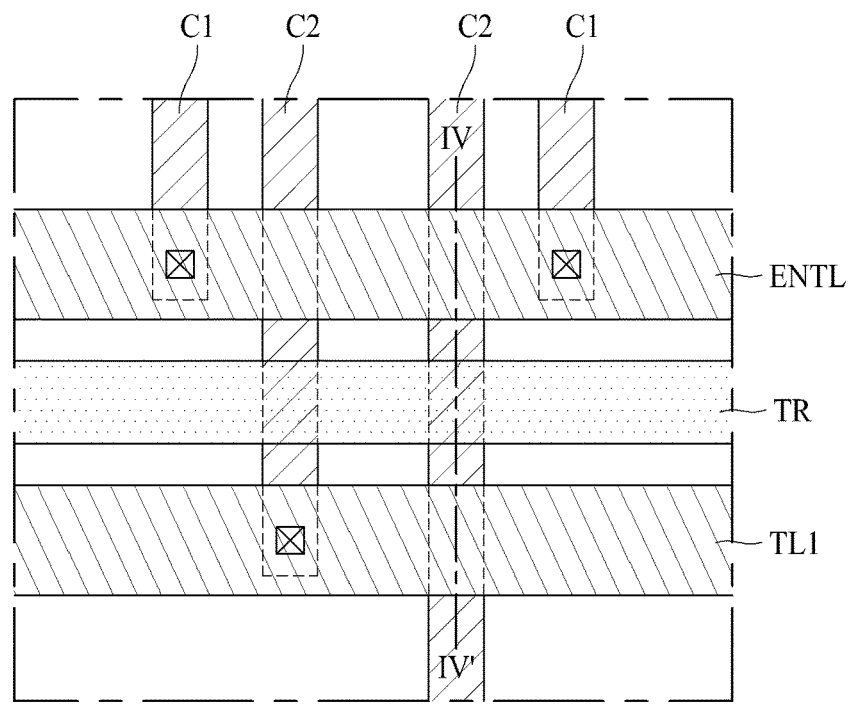
FIG. 10 is an enlarged view of an area G in FIG. 9.
Figure 11:
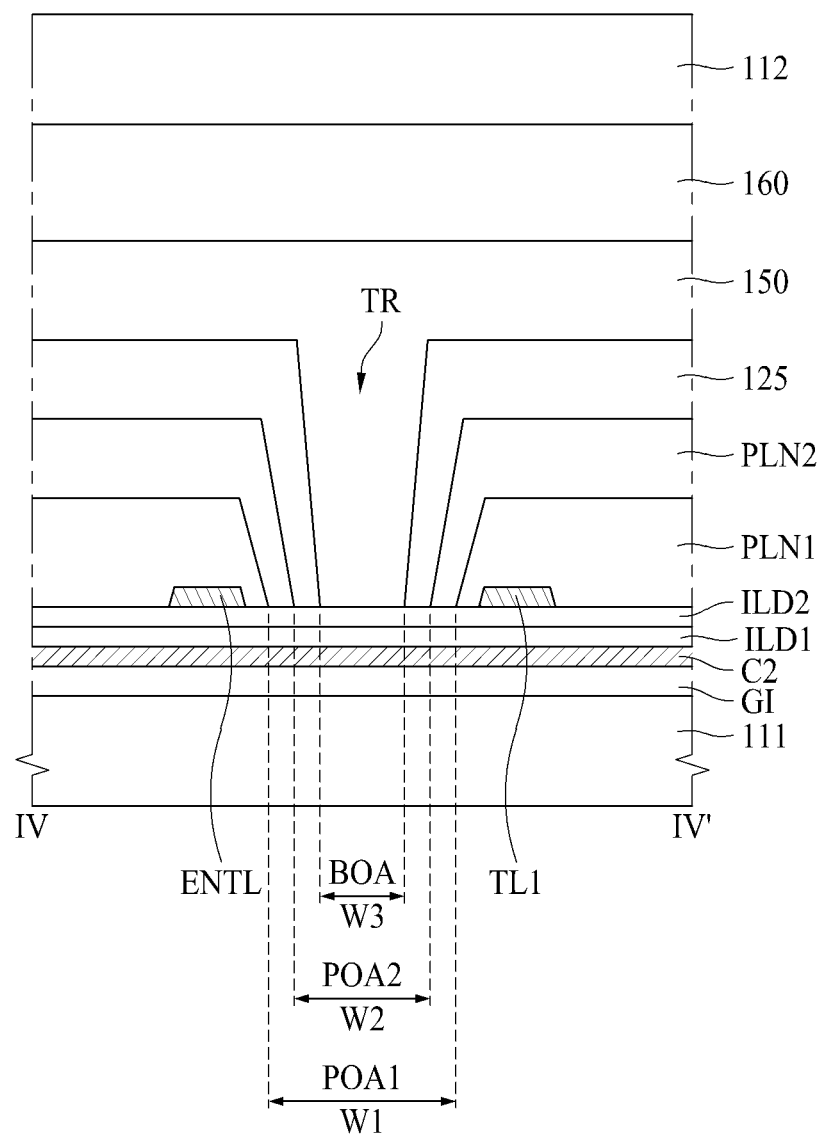
FIG. 11 is a cross-sectional view taken along line IV-IV' of FIG. 10.

FIG. 9 is an enlarged view of an area C in FIG. 2, FIG. 10 is an enlarged view of an area G in FIG. 9, and FIG. 11 is a cross-sectional view taken along line IV-IV' of FIG. 10.

Referring to FIGS. 9 to 11, a plurality of lighting test transistors TT, a trench TR, a plurality of lighting test lines TL and a dam DAM may be provided in the second non-display area NDA2.

The plurality of lighting test lines TL may be lines for testing whether disconnection and defect exist in the plurality of signal lines formed over the first substrate 111. Accordingly, in some embodiments, the plurality of lighting test lines TL may include an enable signal test line ENTL, a first data signal supply line TL1, a second data signal supply line TL2, and a third data signal supply line TL3. The enable signal test line ENTL may be supplied with an enable signal through a test pin, the first data signal supply line TL1 may be supplied with a first data signal through another test pin, the second data signal supply line TL2 may be supplied with a second data signal through still another test pin, and the third data signal supply line TL3 may be supplied with a third data signal through further still another test pin.

These lighting test lines TL may be provided on the same layer as the source electrode SE and the drain electrode DE of the driving transistor T provided in the display area DA. The lighting test lines TL may be made of the same material as that of the source electrode SE and the drain electrode DE of the driving transistor T and may be formed simultaneously with them.

The plurality of lighting test transistors TT may be provided in the second non-display area NDA2. In detail, the plurality of lighting test transistors TT may be provided between the common power line VSS(VSS2) and the plurality of lighting test lines TL, which are disposed in the second non-display area NDA2.

Each of the plurality of lighting test transistors TT may be connected with any one of the first data signal supply line TL1, the second data signal supply line TL2 and the third data signal supply line TL3, the enable signal test line ENTL and the data line DL. If the light test transistor TT connected to the enable signal test line ENTL is turned on, the lighting test transistor TT may supply the data signal supplied from any one of the first data signal supply line TL1, the second data signal supply line TL2 and the third data signal supply line TL3 to the data line DL, whereby a lighting test may be performed.

The trench TR may be provided in the second non-display area NDA2. Here, the trench TR provided in the second non-display area NDA2 may be formed to be connected with the trench TR provided in each of the third non-display area NDA3 and the fourth non-display area NDA4.

The trench TR provided in the second non-display area NDA2 may be provided at an outer edge of the common power line VSS(VSS2). In detail, the trench TR provided in the second non-display area NDA2 may be provided between one of the plurality of lighting test lines TL and one common power line VSS(VSS2).

The trench TR may be formed in at least one insulating film provided over the plurality of lighting test lines TL. In detail, at least one insulating film provided over the plurality of lighting test lines TL may include at least one of the first planarization film PLN1, the second planarization film PLN2 and the bank 125, which are formed to be extended from the display area DA.

The first planarization film PLN1, the second planarization film PLN2 and the bank 125 may be formed over the plurality of lighting test lines as shown in FIG. 11, but are not limited thereto.

The trench TR may be formed in the first planarization film PLN1, the second planarization film PLN2 and the bank 125. The trench TR may be formed to pass through the first planarization film PLN1, the second planarization film PLN2 and the bank 125.

In detail, the first planarization film PLN1 may include a first open area POA1 that exposes the layer therebelow, for example, the second inter-layer insulating layer ILD2 by passing through the corresponding layer from an upper surface to a lower surface at a first width W1. Here, the first width W1 of the first open area POA1 may be narrower than a spaced distance between the lighting test lines TL. For example, the first width W1 of the first open area POA1, as shown in FIG. 11, may be shorter than a distance between the enable signal test line ENTL and the first data signal supply line TL1. Therefore, the first planarization film PLN1 may overlay the lighting test lines TL without exposing them.

The second planarization film PLN2 may include a second open area POA2 that exposes the layer therebelow, for example, the second inter-layer insulating layer ILD2 by passing through the corresponding layer from an upper surface to a lower surface at a second width W2. Here, the second width W2 may be narrower than the first width W1, and the second open area POA2 may be disposed in the first open area POA1. That is, the second planarization film PLN2 may overlay the side of the first planarization film PLN1 exposed from the first open area POA1.

The bank 125 may include a third open area BOA that exposes the layer therebelow, for example, the second inter-layer insulating layer ILD2 by passing through the corresponding layer from an upper surface to a lower surface at a third width W3. Here, the third width W3 may be narrower than the second width W2, and the third open area BOA may be disposed in the second open area POA2. That is, the bank 125 may overlay the second inter-layer insulating layer ILD2 exposed from the second open area POA2.

Consequently, the trench TR may be formed to pass through the first planarization film PLN1, the second planarization film PLN2 and the bank 125, and may correspond to a groove provided in the third open area BOA. The trench TR provided in the second non-display area NDA2, as shown in FIGS. 6, 8 and 11, may have the same width and length as those of the trench TR provided in the third non-display area NDA3 but is not limited thereto.

Meanwhile, in the transparent display panel 110 according to one embodiment of the present disclosure, connection patterns connecting the lighting test transistor TT with the plurality of lighting testing lines TL may be provided on the same layer as the gate electrode GE of the driving transistor T provided in the display area DA. In detail, in the transparent display panel 110 according to one embodiment of the present disclosure, a first connection pattern C1 connecting a gate terminal of the lighting test transistor TT with the enable signal test line ENTL and a second connection pattern C2 connecting a source (or drain) terminal of the lighting test transistor TT with any one of the first data signal supply line TL1, the second data signal supply line TL2 and the third data signal supply line TL3 may be provided in the second non-display area NDA2.

Since the first connection pattern C1 and the second connection pattern C2 cross the trench TR, these connection patterns C1 and C2 may be provided below the trench TR.

For example, the first connection pattern C1 and the second connection pattern C2 may be provided on the same layer as the gate electrode GE of the driving transistor T. The first connection pattern C1 and the second connection pattern C2 may be formed of the same material as that of the gate electrode GE of the driving transistor T and may be formed simultaneously with the gate electrode GE.

Referring to FIG. 2 again, the pads PAD may include a first pad VDDP, a second pad VSSP, a third pad VREFP, and a fourth pad DP, and may be provided in the first non-display area NDA1. That is, the first non-display area NDA1 may include a pad area PA.

The transparent display panel 110 according to one embodiment of the present disclosure may include a plurality of signal lines connected with the subpixels P1, P2 and P3 provided in the display area DA. For example, the transparent display panel 110 according to one embodiment of the present disclosure may include a pixel power line VDD, a common power line VSS and a reference line VREF.

The pixel power line VDD may supply a first power source to the driving transistor T of each of the subpixels P1, P2 and P3 provided in the display area DA.

Accordingly, in some embodiments, the pixel power line VDD may include a first pixel power line VDD1 provided in a first non-display area NDA1, a second pixel power line VDD2 provided in a second non-display area NDA2, and a plurality of third pixel power lines VDDL connecting the first pixel power line VDD1 with the second pixel power line VDD2.

The common power line VSS may supply a second power source to the cathode electrode 140 of the subpixels P1, P2 and P3 provided in the display area DA. Here, the second power source may be a common power source commonly supplied to the subpixels P1, P2 and P3.

Accordingly, in some embodiments, the common power line VSS may include a first common power line VSS1 provided in the first non-display area NDA1, a second common power line VSS2 provided in the second non-display area NDA2, and a plurality of third common power lines VSSL connecting the first common power line VSS1 with the second common power line VSS2.

The reference line VREF may supply an initialization voltage (or sensing voltage) to the driving transistor T of each of the subpixels P1, P2 and P3 provided in the display area DA.

Accordingly, in some embodiments, the reference line VREF may include a first reference line VREF1 provided in the first non-display area NDA1, and a plurality of second reference lines VREFL disposed in the display area DA. The first non-display area NDA1 may also include an area ESDA between the reference line VREF1 and the first common power line VSS1 where electrostatic prevention circuits are disposed, and an area MUXA between the display area DA and the first common power line VSS1 where multiplex circuits are disposed.

Hereinafter, the first pixel power line VDD1, the first common power line VSS1 and the first reference line VREF1, which are provided in a first non-display area NDA1, will be described in more detail with reference to FIGS. 12 to 15.

Figure 12:
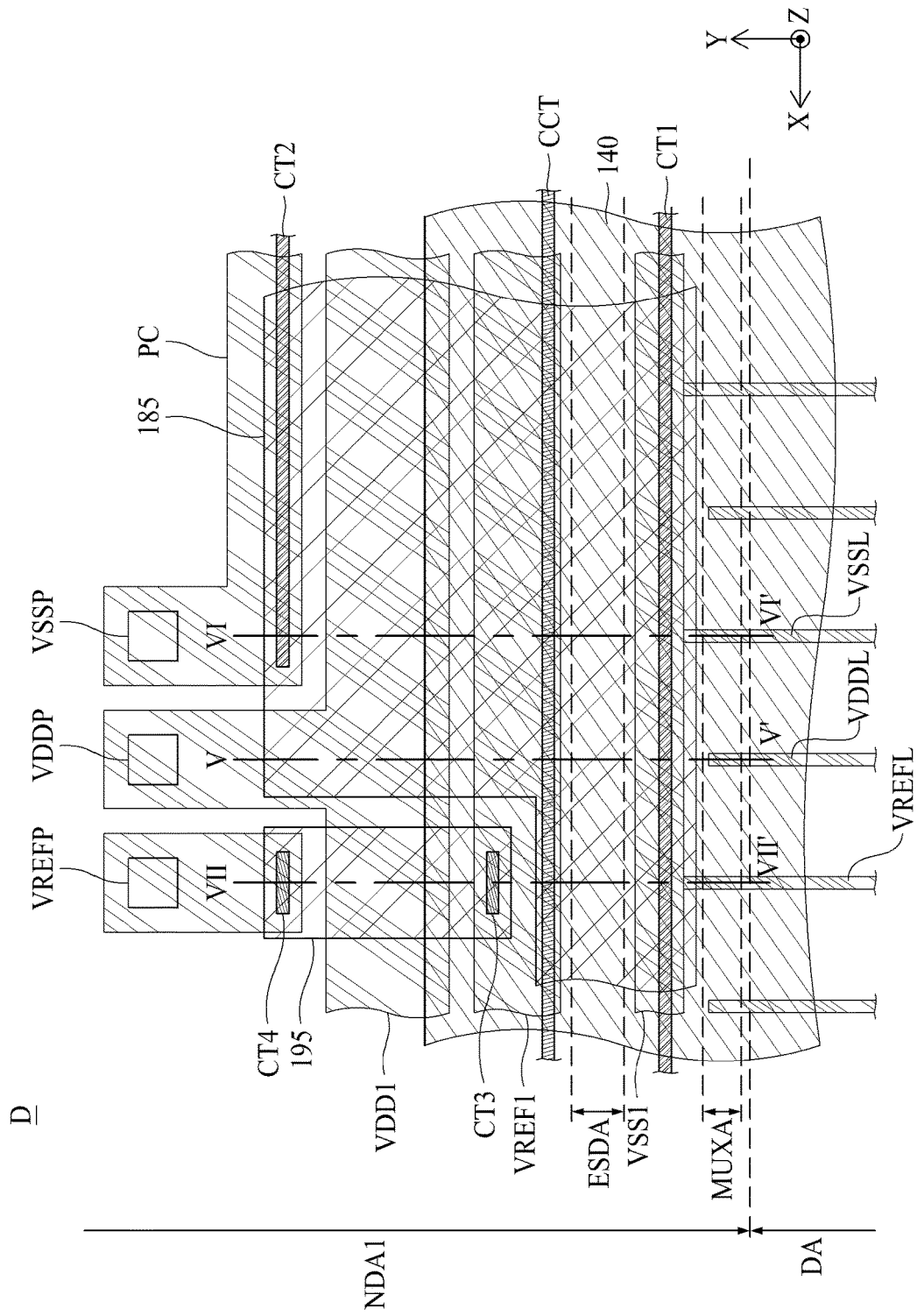
FIG. 12 is an enlarged view of an area D in FIG. 2.
Figure 13:
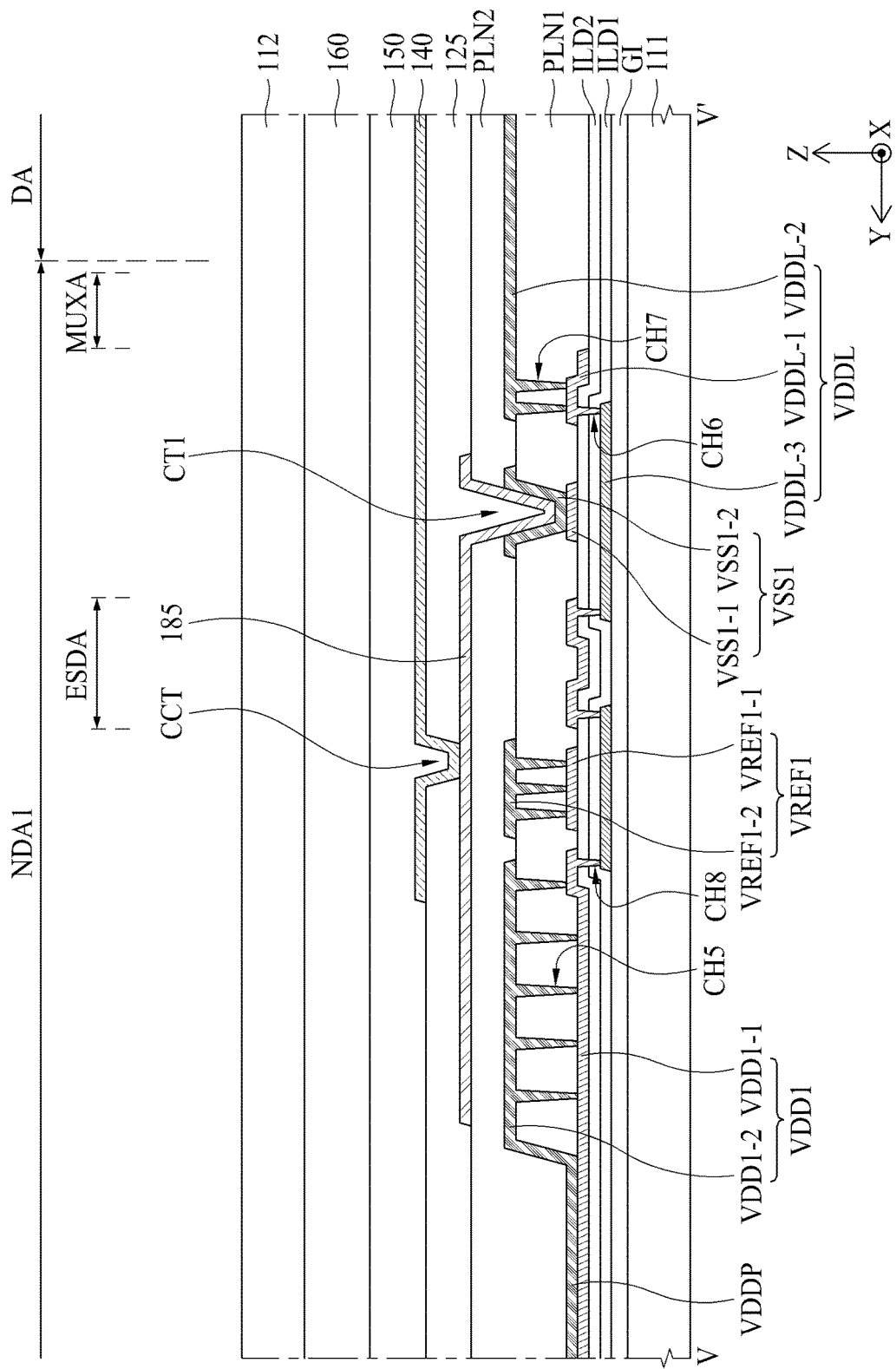
FIG. 13 is a cross-sectional view taken along line V-V' of FIG. 12.
Figure 14:
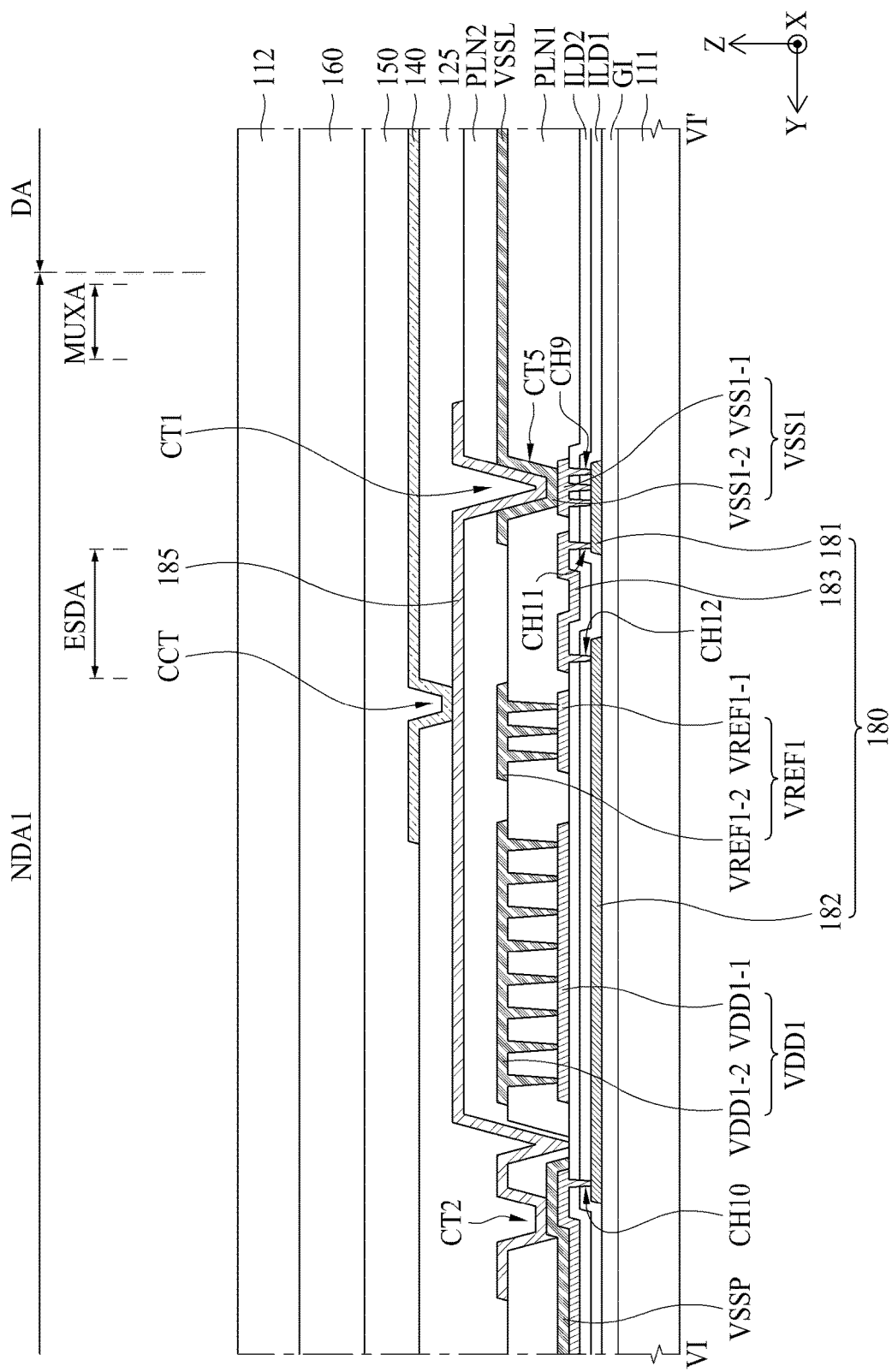
FIG. 14 is a cross-sectional view taken along line VI-VI' of FIG. 12.
Figure 15:
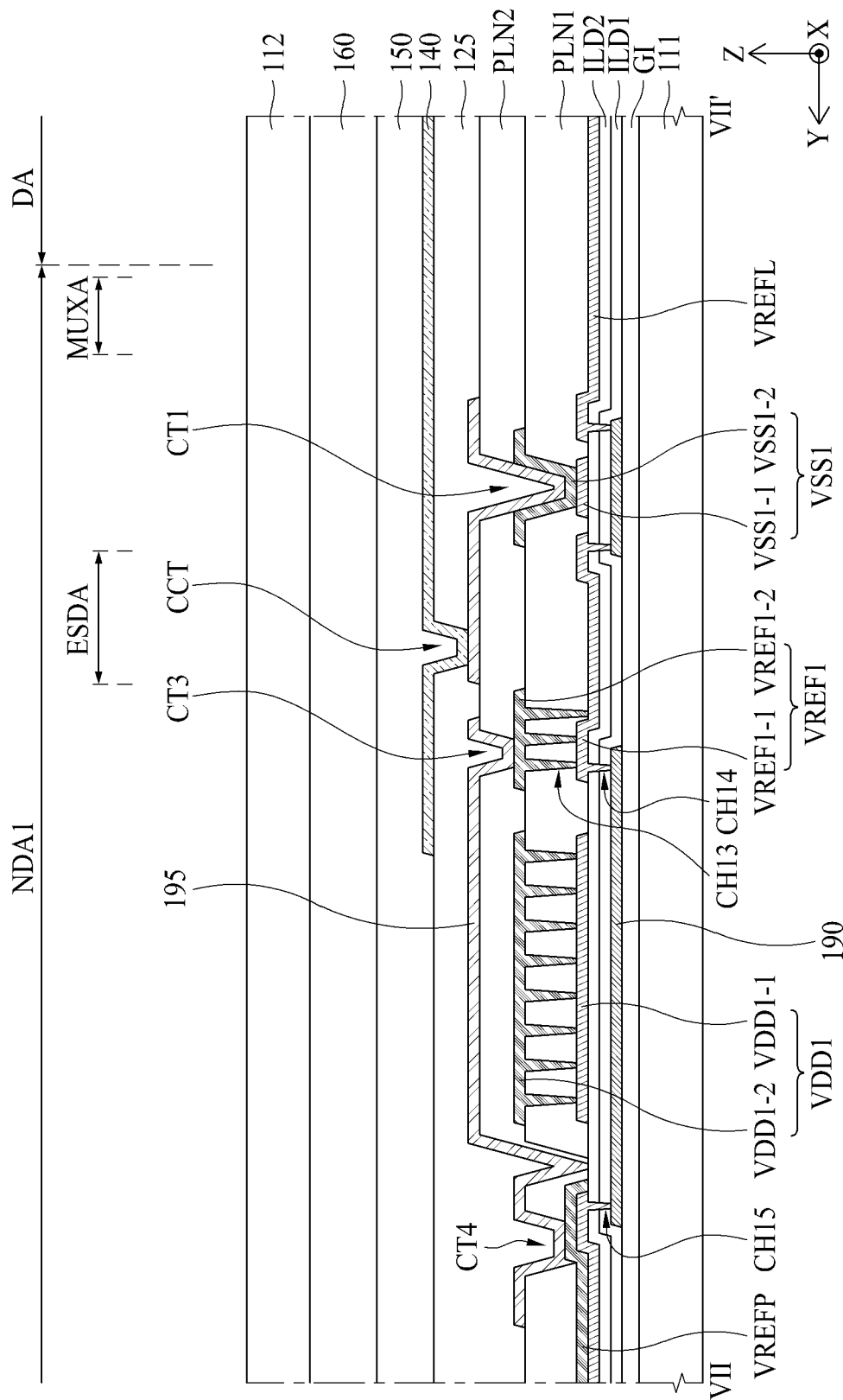
FIG. 15 is a cross-sectional view taken along line VII-VII' of FIG. 12.

FIG. 12 is an enlarged view of an area D in FIG. 2, FIG. 13 is a cross-sectional view taken along line V-V' of FIG. 12, FIG. 14 is a cross-sectional view taken along line VI-VI' of FIG. 12, FIG. 15 is a cross-sectional view taken along line VII-VII' of FIG. 12.

The pads PAD, a first pixel power line VDD1, a first common power line VSS1, a first reference line VREF1, a third pixel power line VDDL and a third common power line VSSL are provided in the first non-display area NDA1.

Referring to FIGS. 2, 12 and 13, the first pixel power line VDD1 may be provided to be extended in the first non-display area NDA1, specifically between the pad area PA and the display area DA in a first direction (X axis direction). The first pixel power line VDD1 may be connected with the first pad VDDP in the first non-display area NDA1, and may be supplied with a first power source from the first pad VDDP. The first pad VDDP may be extended in a second direction (Y axis direction), and may be connected with the first pixel power line VDD1. For example, the first pixel power line VDD1 and the first pad VDDP may be provided in the same layer as shown in FIG. 13, and may be connected with each other without being spaced apart from each other.

Also, the first pixel power line VDD1 may be connected with a plurality of third pixel power lines VDDL disposed in the display area DA, and may supply the first power source to the driving transistor T of each of the subpixels P1, P2 and P3 through the plurality of third pixel power lines VDDL.

The first pixel power line VDD1 may be made of a plurality of metal layers. For example, the first pixel power line VDD1, as shown in FIG. 13, may include a first metal layer VDD1-1 and a second metal layer VDD1-2 provided over the first metal layer VDD1-1. The first metal layer VDD1-1 and the second metal layer VDD1-2 may partially be overlapped with each other, and may be connected with each other through a fifth contact hole CH5.

Here, the first metal layer VDD1-1 of the first pixel power line VDD1 may be provided in the same layer as the source electrode SE and the drain electrode DE of the driving transistor T provided in the display area DA. The first metal layer VDD1-1 may be made of the same material as that of the source electrode SE and the drain electrode DE of the driving transistor T and may be formed simultaneously with them.

The second metal layer VDD1-2 of the first pixel power line VDD1 may be provided in the same layer as the anode auxiliary electrode 115 provided in the display area DA. The second metal layer VDD1-2 may be made of the same material as that of the anode auxiliary electrode 115 and may be formed simultaneously with the anode auxiliary electrode 115. In this case, the second metal layer VDD1-2 of the first pixel power line VDD1 may be connected to the first metal layer VDD1-1 through a plurality of fifth contact holes CH5 that pass through the first planarization layer PLN1.

In the transparent display panel 110 according to one embodiment of the present disclosure, as the first pixel power line VDD1 provided in the non-display area NDA is provided as a double layer, a total area of the first pixel power line VDD1 may be increased, whereby resistance of the first pixel power line VDD1 may be reduced.

Also, in the transparent display panel 110 according to one embodiment of the present disclosure, as the second metal layer VDD1-2 of the first pixel power line VDD1 may be connected to the first metal layer VDD1-1 through the plurality of fifth contact holes CH5, the first metal layer VDD1-1 and the second metal layer VDD1-2 may stably be connected with each other.

Meanwhile, in the transparent display panel 110 according to one embodiment of the present disclosure, the first metal layer VDD1-1 and the second metal layer VDD1-2 of the first pixel power line VDD1 are not in entire contact with each other. If the first metal layer VDD1-1 and the second metal layer VDD1-2 of the first pixel power line VDD1 are in entire contact with each other, even though the second planarization layer PLN2 is deposited over the second metal layer VDD1-2, an upper surface of the area where the first metal layer VDD1-1 and the second metal layer VDD1-2 are in contact with each other may be formed to be recessed toward the first substrate 111 without being planarized. For this reason, a problem may occur in that the layers formed over the first metal layer VDD1-1 and the second metal layer VDD1-2 of the first pixel power line VDD1, for example, a second common power connection electrode 185, the cathode electrode 140, the encapsulation layer 150 are not deposited stably.

In the transparent display panel 110 according to one embodiment of the present disclosure, the first metal layer VDD1-1 and the second metal layer VDD1-2 of the first pixel power line VDD1 may be in contact with each other through the plurality of fifth contact holes CH5 without entire contact. In the transparent display panel 110 according to one embodiment of the present disclosure, if the second planarization layer PLN2 is formed over the second metal layer VDD1-2, a planarized upper surface may be provided even in the area where the first metal layer VDD1-1 and the second metal layer VDD1-2 are in contact with each other. Therefore, in the transparent display panel 110 according to one embodiment of the present disclosure, the layers formed over the first metal layer VDD1-1 and the second metal layer VDD1-2 of the first pixel power line VDD1, for example, the second common power connection electrode 185, the cathode electrode 140, the encapsulation layer 150 may be deposited stably.

The third pixel power line VDDL may be provided between the transmissive areas TA in the display area DA, and thus may be connected with the driving transistor T of each of the subpixels P1, P2 and P3. The third pixel power line VDDL may be extended in the display area DA in a second direction (Y axis direction), and thus its one end may be connected with the first pixel power line VDD1.

Here, the third pixel power line VDDL may be connected with the first pixel power line VDD1 as one layer but may be connected with the first pixel power line VDD1 as a plurality of layers as shown in FIG. 13.

For example, the third pixel power line VDDL may include a second metal layer VDDL-2 and a third metal layer VDDL-3 provided below the second metal layer VDDL-2. The second metal layer VDDL-2 of the third pixel power line VDDL may be extended in the display area DA to the first non-display area NDA1 in a second direction (Y axis direction). The second metal layer VDDL-2 may be provided in the same layer as the anode auxiliary electrode 115 provided in the display area DA. The second metal layer VDDL-2 may be made of the same material as that of the anode auxiliary electrode 115 and may be formed simultaneously with the anode auxiliary electrode 115.

One end of the third metal layer VDDL-3 of the third pixel power line VDDL may be connected to the second metal layer VDDL-2 of the third pixel power line VDDL in the first non-display area NDA1, and the other end thereof may be connected to the first pixel power line VDD1. The third metal layer VDDL-3 may be provided in the same layer as the gate electrode GE of the driving transistor T provided in the display area DA. The third metal layer VDDL-3 may be made of the same material as that of the gate electrode GE of the driving transistor T and may be formed simultaneously with the gate electrode GE.

The third metal layer VDDL-3 of the third pixel power line VDDL may be connected to the second metal layer VDDL-2 of the third pixel power line VDDL at one end through the first metal layer VDDL-1. In this case, the third metal layer VDDL-3 of the third pixel power line VDDL may be connected to the first metal layer VDDL-1 through a sixth contact hole CH6 that passes through the first and second inter-layer insulating layers ILD1 and ILD2. The first metal layer VDDL-1 may be connected to the second metal layer VDDL-2 of the third pixel power line VDDL through a seventh contact hole CH7 that passes through the first planarization layer PLN1. Therefore, the third metal layer VDDL-3 of the third pixel power line VDDL may electrically be connected with the second metal layer VDDL-2 of the third pixel power line VDDL.

Also, the third metal layer VDDL-3 of the third pixel power line VDDL may be connected to the first metal layer VDD1-1 of the first pixel power line VDD1 at the other end through an eighth contact hole CH8 that passes through the first and second inter-layer insulating layers ILD1 and ILD2.

Meanwhile, the third metal layer VDDL-3 of the third pixel power line VDDL may be formed as one line pattern but is not limited thereto. The third metal layer VDDL-3 of the third pixel power line VDDL may include a plurality of line patterns. In this case, the third metal layer VDDL-3 of the third pixel power line VDDL may electrically be connected with the plurality of line patterns through the metal layer provided over another layer, for example, the first metal layer VDDL-1.

Referring to FIGS. 2, 12 and 14, the first common power line VSS1 may be provided to be extended in the first non-display area NDA1, specifically between the first pixel power line VDD1 and the display area DA in a first direction (X axis direction). The first common power line VSS1 may be connected with the second pad VSSP in the first non-display area NDA1, and may be supplied with a second power source from the second pad VSSP. Also, the first common power line VSS1 may be connected with the plurality of third common power lines VSSL disposed in the display area DA, and may supply the second power source to the cathode electrode 140 of the subpixels P1, P2 and P3 through the plurality of third common power lines VSSL.

The first common power line VSS1 may be made of a plurality of metal layers. For example, the first common power line VSS1, as shown in FIG. 14, may include a first metal layer VSS1-1 and a second metal layer VSS1-2 provided over the first metal layer VSS1-1. The first metal layer VSS1-1 and the second metal layer VSS1-2 may partially be overlapped with each other, and may be connected with each other through a fifth contact part CT5.

Here, the first metal layer VSS1-1 of the first common power line VSS1 may be provided in the same layer as the source electrode SE and the drain electrode DE of the driving transistor T provided in the display area DA. The first metal layer VSS1-1 may be made of the same material as that of the source electrode SE and the drain electrode DE of the driving transistor T and may be formed simultaneously with them.

The second metal layer VSS1-2 of the first common power line VSS1 may be provided in the same layer as the anode auxiliary electrode 115 provided in the display area DA. The second metal layer VSS1-2 may be made of the same material as that of the anode auxiliary electrode 115 and may be formed simultaneously with the anode auxiliary electrode 115.

In this case, the second metal layer VSS1-2 of the first common power line VSS1 may be connected to the first metal layer VSS1-1 through the fifth contact part CT5 that passes through the first planarization layer PLN1. The fifth contact part CT5 may partially remove the first planarization layer PLN1 and partially expose the upper surface of the first metal layer VSS1-1 of the first common power line VSS1.

Here, the fifth contact part CT5 may expose the upper surface of the first metal layer VSS1-1 of the first common power line VSS1 along the first direction (X axis direction). The second metal layer VSS1-2 of the first common power line VSS1 may directly in contact with the exposed upper surface of the first metal layer VSS1-1 of the first common power line VSS1. As a result, the second metal layer VSS1-2 of the first common power line VSS1 may have a wide contact area with the first metal layer VSS1-1 of the first common power line VSS1, thereby being stably connected to the first metal layer VSS1-1.

In the transparent display panel 110 according to one embodiment of the present disclosure, as the first common power line VSS1 provided in the first non-display area NDA1 is provided as a double layer, a total area of the first common power line VSS1 may be increased, whereby resistance of the first common power line VSS1 may be reduced.

Meanwhile, the first common power line VSS1 may electrically be connected with the second pad VSSP provided in the pad area PA. Here, the first pixel power line VDD1 and the first reference line VREF1 may be provided between the first common power line VSS1 and the second pad VSSP. If the first common power line VSS1 is formed in the same layer as the first pixel power line VDD1 and the first reference line VREF1, the first common power line VSS1 and the second pad VSSP cannot be formed in the same layer in a single body.

The transparent display panel 110 according to one embodiment of the present disclosure may electrically connect the first common power line VSS1 with the second pad VSSP by using a plurality of connection electrodes disposed on different layers.

In detail, the transparent display panel 110 according to one embodiment of the present disclosure may electrically connect the first common power line VSS1 with the second pad VSSP by using a first common power connection electrode 180 and a second common power connection electrode 185, which are disposed on their respective layers different from each other.

The first common power connection electrode 180 is provided in the first non-display area NDA1. The first common power connection electrode 180 is provided between the first common power line VSS1 and the first substrate 111, and electrically connects the first common power line VSS1 with the second pad VSSP.

For example, the first common power connection electrode 180 may be provided in the same layer as the gate electrode GE of the driving transistor T provided in the display area DA. Also, the first common power connection electrode 180 may be made of the same material as that of the gate electrode GE of the driving transistor T and may be formed simultaneously with the gate electrode GE.

One end of the first common power connection electrode 180 may be connected to the first common power line VSS1 and the other end of the first common power connection electrode 180 may be connected to the second pad VSSP. In detail, the first common power connection electrode 180 may be connected to the first metal layer VSS1-1 of the first common power line VSS1 at one end through an ninth contact hole CH9 that passes through the first and second inter-layer insulating layers ILD1 and ILD2. Also, the first common power connection electrode 180 may be connected to the second pad VSSP at the other end through a tenth contact hole CH10 that passes through the first and second inter-layer insulating layers ILD1 and ILD2.

Meanwhile, the first common power connection electrode 180 may be formed between the second pad VSSP and the first common power line VSS1 as one electrode but is not limited thereto. The first common power connection electrode 180 may include a plurality of electrodes.

For example, the first common power connection electrode 180, as shown in FIG. 14, may include one first common power connection electrode 181, another first common power connection electrode 182, and other first common power connection electrode 183.

One first common power connection electrode 181 may be connected to the first common power line VSS1 through the ninth contact hole CH9, and another first common power connection electrode 182 may be connected to the second pad VSSP through the tenth contact hole CH10. One first common power connection electrode 181 and another first common power connection electrode 182 may be provided in the same layer as the gate electrode GE of the driving transistor T.

One end of the other first common power connection electrode 183 provided over a layer different from one first common power connection electrode 181 and another first common power connection electrode 182 may be connected to the first common power connection electrode 181 through a eleventh contact hole CH11, and the other end thereof may be connected to the first common power connection electrode 182 through an twelfth contact hole CH12. Here, the other first common power connection electrode 183 may be provided in the same layer as the source electrode SE and the drain electrode DE of the driving transistor T.

The second common power connection electrode 185 may be provided in the first non-display area NDA1, and may partially be overlapped with the first common power connection electrode 180. Also, the second common power connection electrode 185 is provided over the first common power line VSS1, and electrically connects the first common power line VSS1 with the second pad VSSP.

For example, the second common power connection electrode 185 may be provided in the same layer as the anode electrode 120 of the light emitting diode provided in the display area DA. Also, the second common power connection electrode 185 may be made of the same material as that of the anode electrode 120 of the light emitting diode and may be formed simultaneously with the anode electrode 120.

One end of the second common power connection electrode 185 may be connected to the first common power line VSS1, and the other end of the second common power connection electrode 185 may be connected to the second pad VSSP. In detail, the second common power connection electrode 185 may be connected to the second metal layer VSS1-2 of the first common power line VSS1 at one end through a first contact part CT1. The first contact part CT1 may partially remove the second planarization layer PLN2 and partially expose the upper surface of the second metal layer VSS1-2 of the first common power line VSS1. Here, the first contact part CT1 may expose the upper surface of the second metal layer VSS1-2 of the first common power line VSS1 along the first direction (X axis direction). The second common power connection electrode 185 may directly in contact with the exposed upper surface of the first common power line VSS1. As a result, the second common power connection electrode 185 may have a wide contact area with the first common power line VSS1, thereby being stably connected to the first common power line VSS1. Meanwhile, at least a part of the first contact part CT1 may be formed to overlap the fifth contact part CT5.

The second common power connection electrode 185 may be connected to the second pad VSSP at the other end through a second contact part CT2. The second contact part CT2 may partially remove the first planarization layer PLN1 and partially expose the upper surface of the second pad VSSP. The second pad VSSP, as shown in FIG. 2, may include a plurality of pad parts. Here, two pad parts disposed to adjoin each other may be connected with each other through a pad connection electrode PC. The second contact part CT2 may expose the upper surface of the second pad VSSP connected by the pad connection electrode PC along the first direction (X axis direction). The second common power connection electrode 185 may directly in contact with the exposed upper surface of the second pad VSSP. As a result, the second common power connection electrode 185 may have a wide contact area with the second pad VSSP, thereby being stably connected to the second pad VSSP.

Also, the second common power connection electrode 185 may electrically be connected with the cathode electrode 140 through a cathode contact part CCT in the first non-display area NDA1. The cathode contact part CCT may partially remove the bank 125 and partially expose the upper surface of the second common power connection electrode 185. The cathode contact part CCT may expose the upper surface of the second common power connection electrode 185 along the first direction (X axis direction). As a result, the second common power connection electrode 185 may have a wide contact area with the cathode electrode 140, thereby being stably connected to the cathode electrode 140.

Consequently, the first common power line VSS1 may electrically be connected with the cathode electrode 140 through the second common power connection electrode 185. Therefore, the first common power line VSS1 may supply the second power source forwarded from the second pad VSSP to the cathode electrode 140.

The transparent display panel 110 according to one embodiment of the present disclosure may electrically connect the first common power line VSS1 and the second pad VSSP, which are disposed in the first non-display area NDA1, with each other by using the first common power connection electrode 180 and the second common power connection electrode 185 disposed on their respective layers different from each other. Here, the first common power connection electrode 180 may be provided below the first common power line VSS1 and the second pad VSSP, and the second common power connection electrode 185 may be provided over the first common power line VSS1 and the second pad VSSP.

Therefore, the transparent display panel 110 according to one embodiment of the present disclosure may increase a total area of the common power line VSS, whereby resistance of the common power line VSS may be reduced.

Also, in the transparent display panel 110 according to one embodiment of the present disclosure, even though a defect occurs in any one of the first common power connection electrode 180 and the second common power connection electrode 185, the first common power line VSS1 and the second pad VSSP may be connected with each other by the other one. Therefore, since the transparent display panel 110 according to one embodiment of the present disclosure may stably supply the first power source to the subpixels P1, P2 and P3, panel yield may be improved.

The third common power line VSSL is provided between the transmissive areas TA in the display area DA. Here, the transparent display panel 110 according to one embodiment of the present disclosure may reduce or minimize the non-transmissive area NTA in the display area DA by alternately disposing the third common power line VSSL and the third pixel power line VDDL between the transmissive areas TA. Therefore, the transparent display panel 110 according to one embodiment of the present disclosure may enhance transmittance by increasing the transmissive area TA.

Meanwhile, the third common power line VSSL may be extended in the display area DA in a second direction (Y axis direction), and thus its one end may be connected with the first common power line VSS1 and its other end may be connected with the second common power line VSS2. For example, the third common power line VSSL and the first common power line VSS1, as shown in FIG. 14, may be provided in the same layer, and may be connected with each other without being spaced apart from each other.

Referring to FIGS. 2, 12 and 15, the first reference line VREF1 may be provided to be extended in the first non-display area NDA1, specifically between the first pixel power line VDD1 and the first common power line VSS1 in a first direction (X axis direction). The first reference line VREF1 may be connected with the third pad VREFP in the first non-display area NDA1, and may be supplied with the initialization voltage (or sensing voltage) from the third pad VREFP. Also, the first reference line VREF1 may be connected with the plurality of second reference lines VREFL disposed in the display area DA, and may supply the initialization voltage (or sensing voltage) to the transistor T of each of the subpixels P1, P2 and P3 through the plurality of second reference lines VREFL.

The first reference line VREF1 may be made of a plurality of metal layers. For example, the first reference line VREF1, as shown in FIG. 15, may include a first metal layer VREF1-1 and a second metal layer VREF1-2 provided over the first metal layer VREF1-1. The first metal layer VREF1-1 and the second metal layer VREF1-2 may partially be overlapped with each other, and may be connected with each other through a thirteenth contact hole CH13.

Here, the first metal layer VREF1-1 of the first reference line VREF1 may be provided in the same layer as the source electrode SE and the drain electrode DE of the driving transistor T provided in the display area DA. The first metal layer VREF1-1 may be made of the same material as that of the source electrode SE and the drain electrode DE of the driving transistor T and may be formed simultaneously with them.

The second metal layer VREF1-2 of the first reference line VREF1 may be provided in the same layer as the anode auxiliary electrode 115 provided in the display area DA. The second metal layer VREF1-2 may be made of the same material as the anode auxiliary electrode 115 and may be formed simultaneously with the anode auxiliary electrode 115. In this case, the second metal layer VREF1-2 of the first reference line VREF1 may be connected to the first metal layer VREF1-1 through the thirteenth contact hole CH13 that passes through the first planarization layer PLN1.

In the transparent display panel 110 according to one embodiment of the present disclosure, as the first reference line VREF1 provided in the non-display area NDA is provided as a double layer, a total area of the first reference line VREF1 may be increased, whereby resistance of the first reference line VREF1 may be reduced.

Meanwhile, the first reference line VREF1 may electrically be connected with the third pad VREFP provided in the pad area PA. Here, the first pixel power line VDD1 may be provided between the first reference line VREF1 and the third pad VREFP. If the first reference line VREF1 is formed in the same layer as the first pixel power line VDD1, the first reference line VREF1 and the third pad VREFP cannot be formed in the same layer in a single body.

The transparent display panel 110 according to one embodiment of the present disclosure may electrically connect the first reference line VREF1 with the third pad VREFP by using a plurality of connection electrodes disposed over different layers.

In detail, the transparent display panel 110 according to one embodiment of the present disclosure may electrically connect the first reference line VREF1 with the third pad VREFP by using a first reference connection electrode 190 and a second reference connection electrode 195, which are disposed on their respective layers different from each other.

The first reference connection electrode 190 is provided in the first non-display area NDA1. The first reference connection electrode 190 is provided between the first reference line VREF1 and the first substrate 111, and electrically connects the first reference line VREF1 with the third pad VREFP.

For example, the first reference connection electrode 190 may be provided in the same layer as the gate electrode GE of the driving transistor T provided in the display area DA. Also, the first reference connection electrode 190 may be made of the same material as that of the gate electrode GE of the driving transistor T and may be formed simultaneously with the gate electrode GE.

One end of the first reference connection electrode 190 may be connected to the first reference line VREF1 and the other end of the first reference connection electrode 190 may be connected to the third pad VREFP. In detail, the first reference connection electrode 190 may be connected to the first metal layer VREF1-1 of the first reference line VREF1 at one end through a fourteenth contact hole CH14 that passes through the first and second inter-layer insulating layers ILD1 and ILD2. Also, the first reference connection electrode 190 may be connected to the third pad VREFP at the other end through a fifteenth contact hole CH15 that passes through the first and second inter-layer insulating layers ILD1 and ILD2.

Meanwhile, the first reference connection electrode 190 may be formed between the first reference line VREF1 and the third pad VREFP as one electrode but is not limited thereto. The first reference connection electrode 190 may include a plurality of electrodes.

The second reference connection electrode 195 may be provided in the first non-display area NDA1. At least a part of the second reference connection electrode 195 may be overlapped with the first reference connection electrode 190. The second reference connection electrode 195 is provided over the first reference line VREF1, and electrically connects the first reference line VREF1 with the third pad VREFP.

For example, the second reference connection electrode 195 may be provided in the same layer as the anode electrode 120 of the light emitting diode provided in the display area DA. Also, the second reference connection electrode 195 may be made of the same material as that of the anode electrode 120 of the light emitting diode and may be formed simultaneously with the anode electrode 120.

One end of the second reference connection electrode 195 may be connected to the first reference line VREF1 and the other end thereof may be connected to the third pad VREFP. In detail, the second reference connection electrode 195 may be connected to the second metal layer VREF1-2 of the first reference line VREF1 at one end through a third contact part CT3. The third contact part CT3 may partially remove the second planarization layer PLN2 and partially expose the upper surface of the second metal layer VREF1-2 of the first reference line VREF1. Here, the third contact part CT3 may expose the upper surface of the second metal layer VREF1-2 of the first reference line VREF1 along the first direction (X axis direction). As a result, the second reference connection electrode 195 may have a wide contact area with the first reference line VREF1, thereby being stably connected to the first reference line VREF1.

The second reference connection electrode 195 may be connected to the third pad VREFP at the other end through a fourth contact part CT4. The fourth contact part CT4 may partially remove the first planarization layer PLN1 and partially expose the upper surface of the third pad VREFP. Here, the fourth contact portion CT4 may expose the upper surface of the third pad VREFP along the first direction (X axis direction). The second reference connection electrode 195 may directly in contact with the exposed upper surface of the third pad VREFP. As a result, the second reference connection electrode 195 may have a wide contact area with the third pad VREFP, thereby being stably connected to the third pad VREFP.

The second reference connection electrode 195 is formed in the same layer as the second common power connection electrode 185 but is spaced apart from the second common power connection electrode 185. Therefore, the second reference connection electrode 195 is not electrically connected with the second common power connection electrode 185.

The transparent display panel 110 according to one embodiment of the present disclosure may connect the first reference line VREF1 and the third pad VREFP, which are disposed in the first non-display area NDA1, with each other by using the first reference connection electrode 190 and the second reference connection electrode 195 disposed on their respective layers different from each other. Here, the first reference connection electrode 190 may be provided below the first reference line VREF1 and the third pad VREFP, and the second reference connection electrode 195 may be provided over the first reference line VREF1 and the third pad VREFP.

Therefore, the transparent display panel 110 according to one embodiment of the present disclosure may increase a total area of the first reference line VREF1, whereby resistance of the first reference line VREF1 may be reduced.

Also, in the transparent display panel 110 according to one embodiment of the present disclosure, even though a defect occurs in any one of the first reference connection electrode 190 and the second reference connection electrode 195, the first reference line VREF1 and the third pad VREFP may be connected with each other by the other one. Therefore, since the transparent display panel 110 according to one embodiment of the present disclosure may stably supply the initialization voltage (or sensing voltage) to the subpixels P1, P2 and P3, panel yield may be improved.

Also, the transparent display panel 110 according to one embodiment of the present disclosure may test a defect of the driving transistor T before the anode electrode 120 is deposited.

In some embodiments, thetransparent display panel 110 may connect the first common power line VSS1 with the second pad VSSP by using only the second common power connection electrode 185 provided in the same layer as the anode electrode 120. Also, the transparent display panel 110 may connect the first reference line VREF1 with the third pad VREFP by using only the second reference connection electrode 195 provided in the same layer as the anode electrode 120.

In this case, a process of testing a defect of the driving transistor T has no choice but to be performed after the anode electrode 120 is deposited. If a defect occurs in the driving transistor T, a repair process may be performed to repair a portion where the defect has occurred. Here, the layers deposited on the layer where the defect has occurred should be removed to perform the repair process. For example, if the defect occurs in the layer provided with the anode auxiliary electrode 115, the second planarization layer PLN2 and the anode electrode 120 should be removed for the repair process. Here, luminescence may not be performed in the corresponding area.

In this way, if the repair process is performed after the anode electrode 120 is formed, repair yield is reduced due to the anode electrode 120 and the organic layer PLN2 provided over the anode auxiliary electrode 115, and a tact time is increased.

The transparent display panel 110 according to one embodiment of the present disclosure may connect the first common power line VSS1 with the second pad VSSP by using the first common power connection electrode 180 and the second common power connection electrode 185. Also, the transparent display panel 110 according to one embodiment of the present disclosure may connect the first common power line VSS1 with the second pad VSSP through the first common power connection electrode 180 even though the second common power connection electrode 185 is not formed.

The transparent display panel 110 according to one embodiment of the present disclosure may connect the first reference line VREF1 with the third pad VREFP by using the first reference connection electrode 190 and the second reference connection electrode 195. Also, the transparent display panel 110 according to one embodiment of the present disclosure may connect the first reference line VREF1 with the third pad VREFP through the first reference connection electrode 190 even though the second reference connection electrode 195 is not formed.

Therefore, the transparent display panel 110 according to one embodiment of the present disclosure may test a defect of the driving transistor T before the anode electrode 120 is deposited. That is, since the repair process is performed before the second planarization layer PLN2 and the anode electrode 120 are deposited, the transparent display panel 110 according to one embodiment of the present disclosure may prevent repair yield from being reduced due to the second planarization layer PLN2 and the anode electrode 120. In addition, the transparent display panel 110 according to one embodiment of the present disclosure may reduce a tact time.

Hereinafter, the second pixel power line VDD2 and the second common power line VSS2 provided in the second non-display area NDA2 will be described in more detail with reference to FIGS. 16 to 19.

Figure 16:
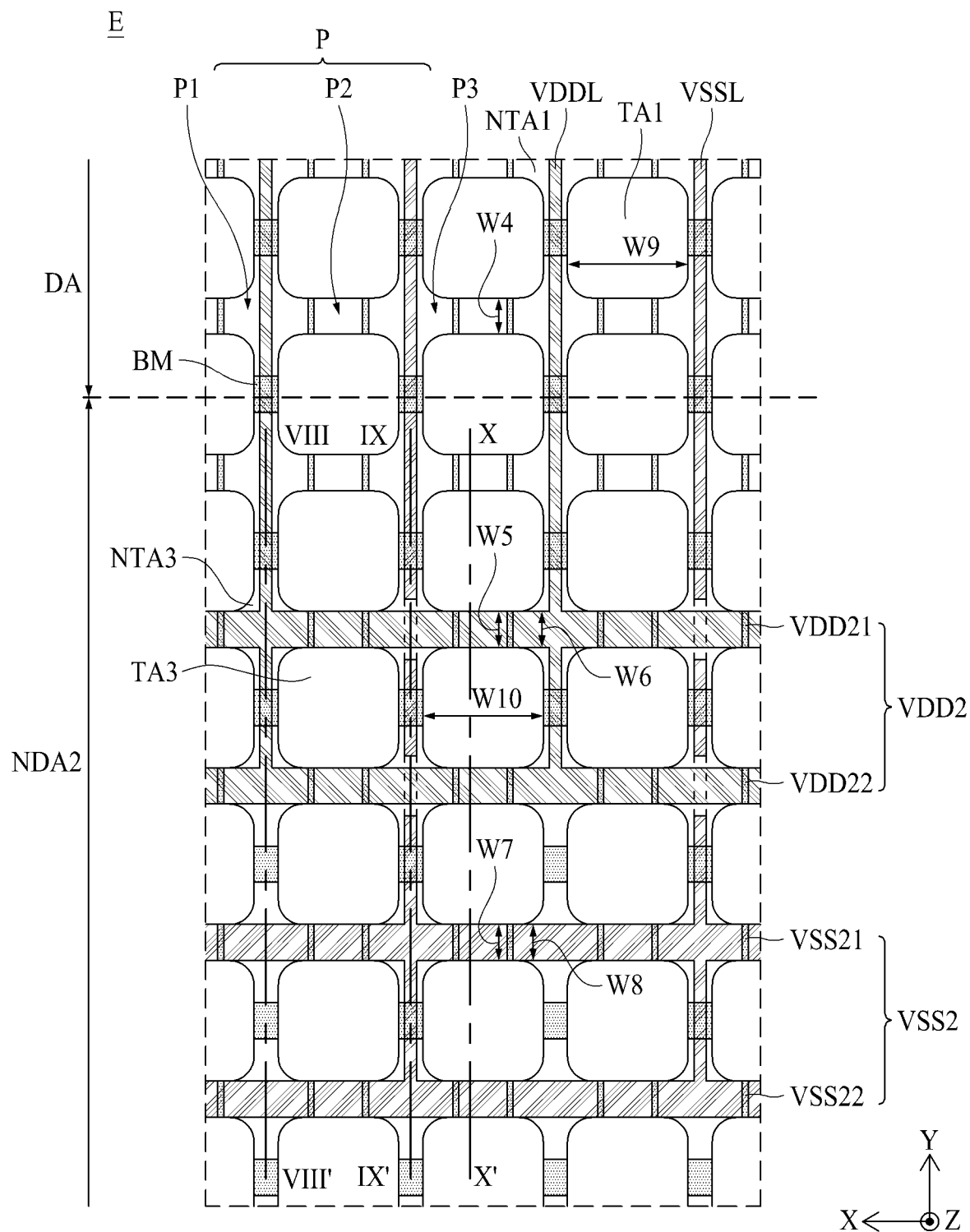
FIG. 16 is an enlarged view of an area E in FIG. 2.
Figure 17:
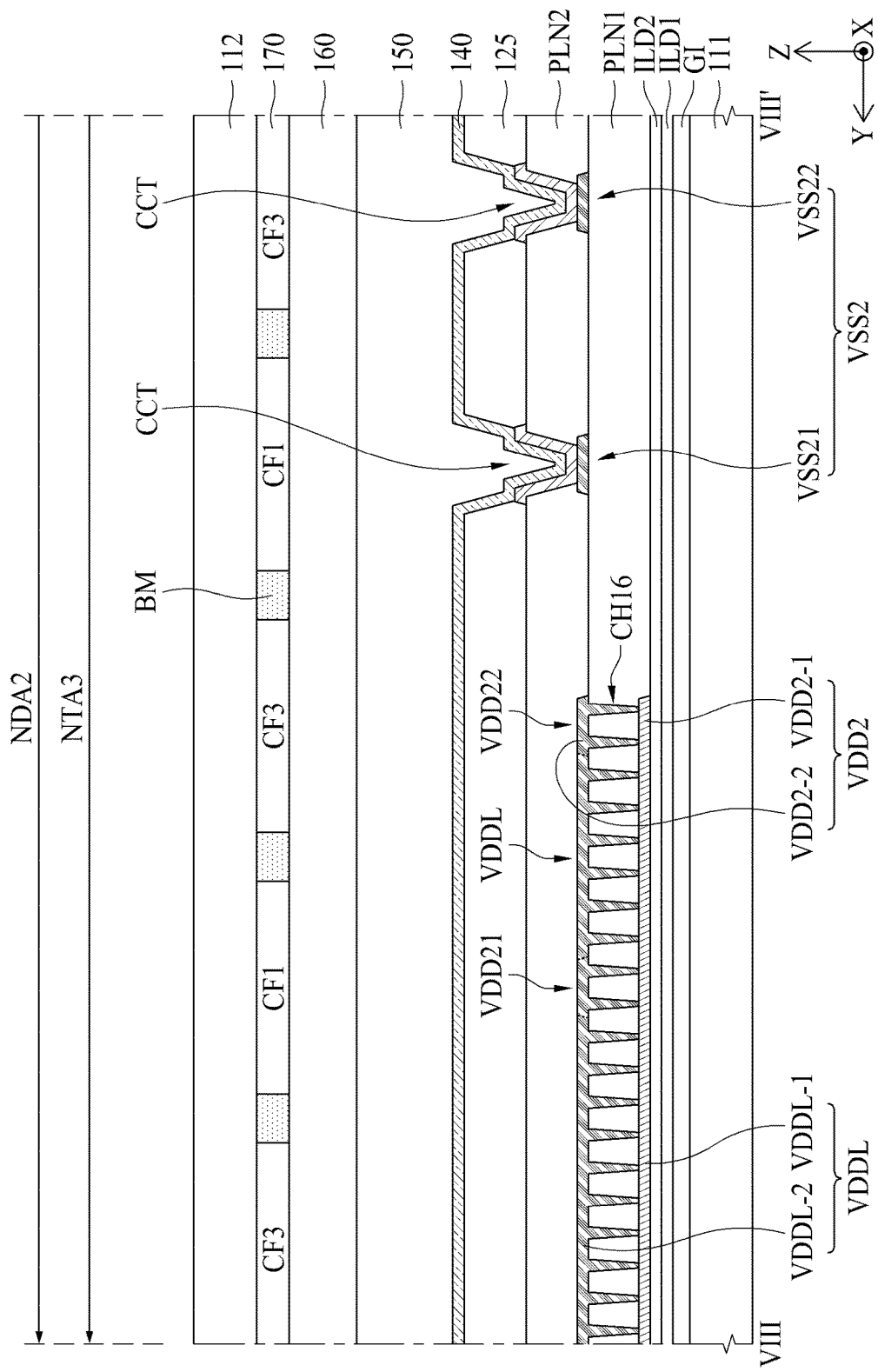
FIG. 17 is a cross-sectional view taken along line VIII-VIII' of FIG. 16.
Figure 18:
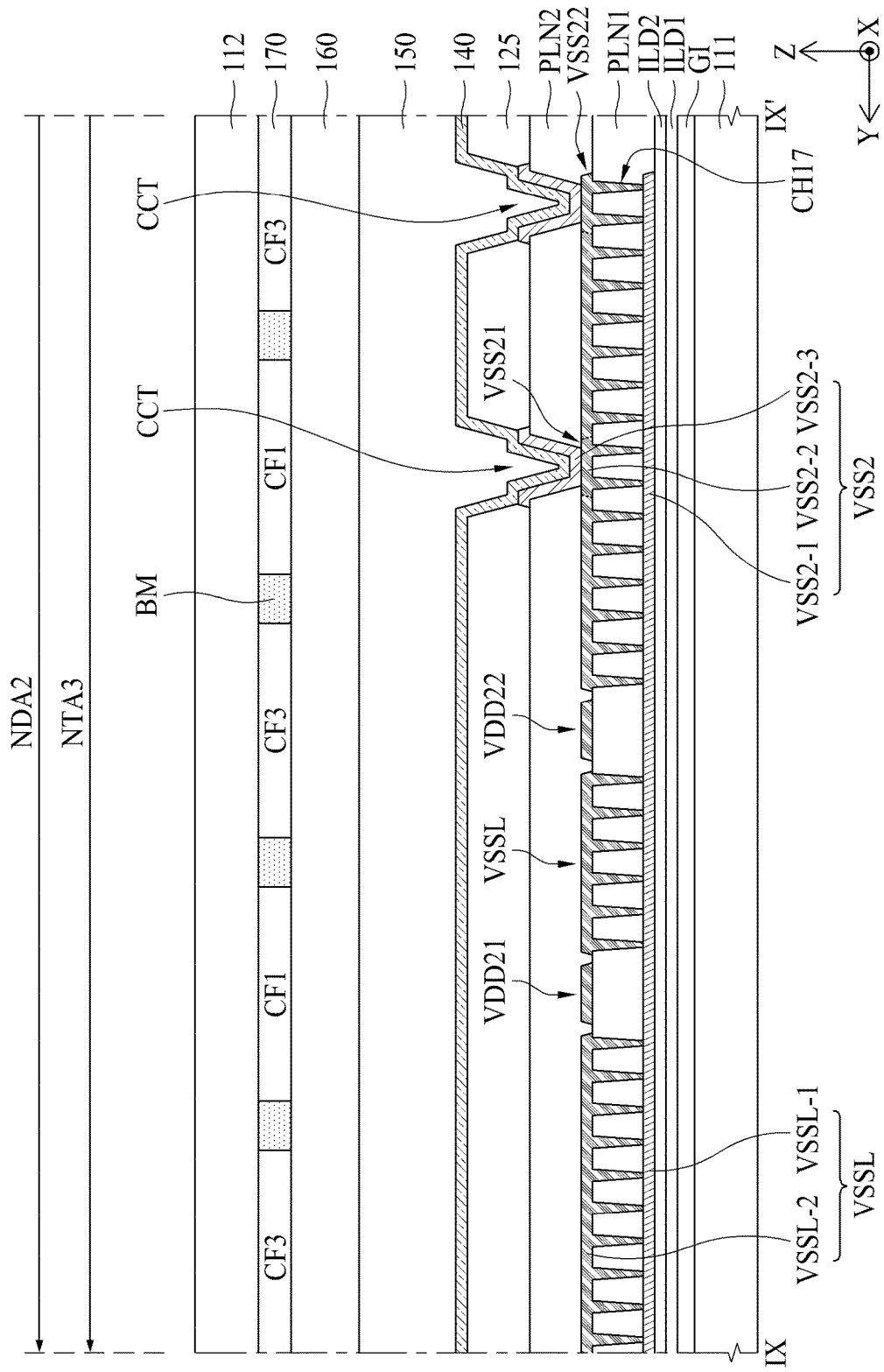
FIG. 18 is a cross-sectional view taken along line IX-IX' of FIG. 16.
Figure 19:
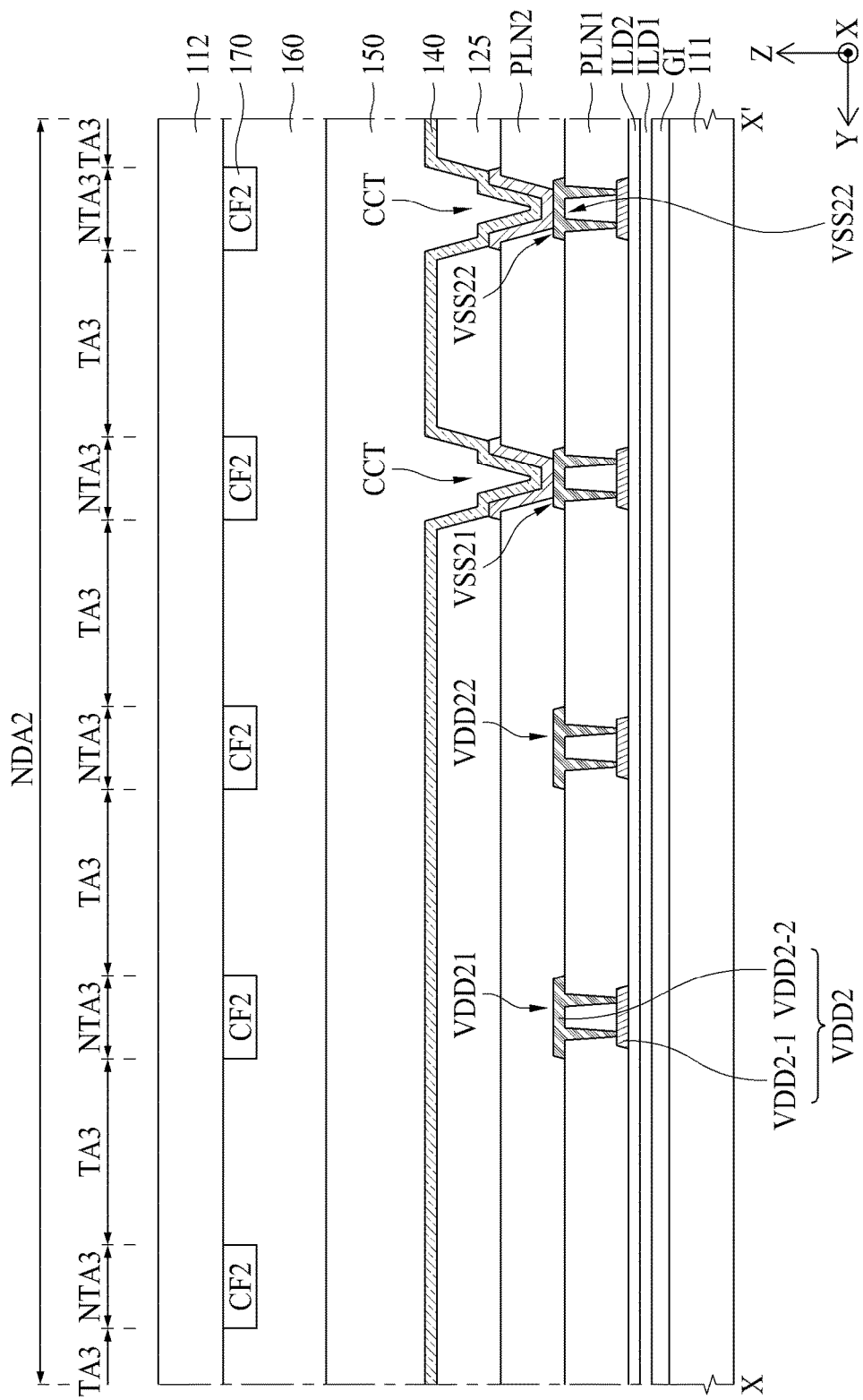
FIG. 19 is a cross-sectional view taken along line X-X' of FIG. 16.

FIG. 16 is an enlarged view of an area E in FIG. 2, FIG. 17 is a cross-sectional view taken along line VIII-VIII' of FIG. 16, FIG. 18 is a cross-sectional view taken along line IX-IX' of FIG. 16, FIG. 19 is a cross-sectional view taken along line X-X' of FIG. 16.

The display area DA, as shown in FIG. 16, may include first non-transmissive areas NTA1, and first transmissive areas TA1 provided between the first non-transmissive areas NTA1. The first transmissive area TA1 is an area through which most of externally incident light passes, and the first non-transmissive area NTA1 is an area through which most of externally incident light fails to transmit.

The first non-transmissive area NTA1 may be provided with third pixel power lines VDDL, third common power lines VSSL, reference lines, data lines, gate lines GL, and pixels P1, P2 and P3.

The gate lines GL may be extended in a first direction (X axis direction), and may cross the third pixel power lines VDDL, the third common power lines VSSL and the data lines in the display area DA.

The third pixel power lines VDDL, the third common power lines VSSL, and the data lines may be extended in a second direction (Y axis direction). Here, the third pixel power lines VDDL and the third common power lines VSSL may alternately be disposed in the display area DA. The first transmissive area TA1 may be disposed between the third pixel power line VDDL and the third common power line VSSL.

The second non-display area NDA2 may include third non-transmissive areas NTA3, and third transmissive areas TA3 provided between the third non-transmissive areas NTA3. The third transmissive area TA3 is an area through which most of externally incident light passes as it is, and the third non-transmissive area NTA3 is an area through which most of externally incident light fails to transmit.

The third non-transmissive area NTA3 may be provided with second pixel power lines VDD2, second common power lines VSS2, third pixel power lines VDDL and third common power lines VSSL.

The second pixel power line VDD2 may be extended from the second non-display area NDA2 in a first direction (X axis direction). The second pixel power line VDD2 may be provided in the second non-display area NDA2 in a plural number. The number of second pixel power lines VDD2 may be, but not limited to, 2 as shown in FIG. 16. The number of second pixel power lines VDD2 may be three or more.

One second pixel power line VDD21 is disposed to be spaced apart from the other second pixel power line VDD22. Here, the third transmissive area TA3 may be provided between one second pixel power line VDD21 and the other second pixel power line VDD22.

The third transmissive area TA3 provided between one second pixel power line VDD21 and the other second pixel power line VDD22 may substantially have the same shape as that of the first transmissive area TA1 provided in the display area DA. In this case, the substantially same shape means that shapes on a plane have the same property. Sizes or rates of the shapes may be equal to or different from each other.

For example, the first transmissive area TA1 provided in the display area DA may have a rectangular shape, and may have a rounded corner but is not limited thereto. In this case, the third transmissive area TA3 may also have a rectangular shape, and may have a rounded corner.

In the third non-transmissive area NTA3 provided with one second pixel power line VDD21 and the other second pixel power line VDD22, a width W5 in a second direction perpendicular to a first direction may be equal to a width W4 in a second direction of the first non-transmissive area NTA1 provided in the display area DA.

Each of one second pixel power line VDD21 and the other second pixel power line VDD22 may be disposed in the third non-transmissive area NTA3. Therefore, as shown in FIG. 16, each of one second pixel power line VDD21 and the other second pixel power line VDD22 may have a width W6 equal to the width W5 of the third non-transmissive area NTA3 or a width W6 narrower than the width W5 of the third non-transmissive area NTA3.

Consequently, the plurality of second pixel power lines VDD2 disposed in the second non-display area NDA2 may have a width W6 equal to the width W4 in the second direction of the first non-transmissive area NTA1 provided in the display area DA or a width W6 narrower than the width W4 in the second direction of the first non-transmissive area NTA1.

In the transparent display panel 110 according to one embodiment of the present disclosure, the second pixel power line VDD2 provided in the second non-display area NDA2 does not have a wide width. In the transparent display panel 110 according to one embodiment of the present disclosure, the width W6 of the second pixel power line VDD2 may be formed to be equal to or narrower than the width W4 of the first non-transmissive area NTA1 provided in the display area DA, whereby the wide third transmissive area TA3 may be obtained in the second non-display area NDA2.

Meanwhile, in the transparent display panel 110 according to one embodiment of the present disclosure, the second pixel power line VDD2 may be formed in a plural al number, whereby a total area of the second pixel power line VDD2 may be increased.

Moreover, in the transparent display panel 110 according to one embodiment of the present disclosure, the second pixel power line VDD2 may be formed of a plurality of metal layers to increase its total area.

In detail, the second pixel power line VDD2 may be provided with a plurality of metal layers. For example, the second pixel power line VDD2, as shown in FIG. 17, may include a first metal layer VDD2-1 and a second metal layer VDD2-2 provided over the first metal layer VDD2-1. The first metal layer VDD2-1 and the second metal layer VDD2-2 may partially be overlapped with each other, and may be connected with each other through a sixteenth contact hole CH16.

Here, the first metal layer VDD2-1 of the second pixel power line VDD2 may be made of an opaque metal material of low resistance. For example, the first metal layer VDD2-1 of the second pixel power line VDD2 may be provided on the same layer as the source electrode SE and the drain electrode DE of the driving transistor T provided in the display area DA. The first metal layer VDD2-1 may be made of the same material as that of the source electrode SE and the drain electrode DE of the driving transistor T and may be formed simultaneously with them.

The second metal layer VDD2-2 of the second pixel power line VDD2 may be made of an opaque metal material of low resistance. For example, the second metal layer VDD2-2 of the second pixel power line VDD2 may be provided on the same layer as the anode auxiliary electrode 115 provided in the display area DA. The second metal layer VDD2-2 may be made of the same material as that of the anode auxiliary electrode 115 and may be formed simultaneously with the anode auxiliary electrode 115. In this case, the second metal layer VDD2-2 of the second pixel power line VDD2 may be connected to the first metal layer VDD2-1 through a plurality of sixteenth contact holes CH16 that pass through the first planarization film PLN1.

In the transparent display panel 110 according to one embodiment of the present disclosure, as each of the plurality of second pixel power lines VDD2 provided in the second non-display area NDA2 is provided with a double layer, a total area of the second pixel power line VDD2 may be increased. Therefore, in the transparent display panel 110 according to one embodiment of the present disclosure, even though the width W6 of the second pixel power line VDD2 is formed to be narrow, whereby resistance of the second pixel power line VDD2 may be prevented from being increased.

Also, in the transparent display panel 110 according to one embodiment of the present disclosure, as the second metal layer VDD2-2 of the second pixel power line VDD2 may be connected to the first metal layer VDD2-1 of the second pixel power line VDD2 through the plurality of sixteenth contact holes CH16, the first metal layer VDD2-1 and the second metal layer VDD2-2 may stably be connected with each other.

Each of the third pixel power lines VDDL may be extended from the display area DA in a second direction (Y axis direction) and connected with the second pixel power line VDD2. The third pixel power line VDDL may be connected to one second pixel power line VDD21 and the other second pixel power line VDD22. In detail, each of the third pixel power lines VDDL may be extended from the display area DA in a second direction (Y axis direction), and thus may be connected with one end of one second pixel power line VDD21. Also, each of the third pixel power lines VDDL may be extended from the other end of one second pixel power line VDD21 in a second direction (Y axis direction), and thus may be connected with one end of the other second pixel power line VDD22. Therefore, one second pixel power line VDD21, the other second pixel power line VDD22 and the third pixel power lines VDDL may electrically be connected with one another.

The third pixel power lines VDDL may be formed on the same layer as the second pixel power line VDD2 in the second non-display area NDA2. In detail, the third pixel power line VDDL may include a first metal layer VDDL-1 and a second metal layer VDDL-2 in the second non-display area NDA2. The first metal layer VDDL-1 of the third pixel power line VDDL may be extended from the first metal layer VDD2-1 of the second pixel power line VDD2, and the second metal layer VDDL-2 of the third pixel power line VDDL may be extended from the second metal layer VDD2-2 of the second pixel power line VDD2.

In some embodiments, the third pixel power lines VDDL may be extended from the display area DA to only an upper layer VDDL-2.

The second common power line VSS2 may be extended from the second non-display area NDA2 in a first direction (X axis direction). The second common power line VSS2 may be provided in the second non-display area NDA2 in a plural number. The number of second common power lines VSS2 may be, but not limited to, 2 as shown in FIG. 16. The number of second common power lines VSS2 may be three or more.

One second common power line VSS21 is disposed to be spaced apart from the other second common power line VSS22. Here, the third transmissive area TA3 may be provided between one second common power line VSS21 and the other second common power line VSS22.

The third transmissive area TA3 provided between one second common power line VSS21 and the other second common power line VSS22 may substantially have the same shape as that of the first transmissive area TA1 provided in the display area DA. In this case, the substantially same shape means that shapes on a plane have the same property. Sizes or rates of the shapes may be equal to or different from each other.

For example, the first transmissive area TA1 provided in the display area DA may have a rectangular shape, and may have a rounded corner but is not limited thereto. In this case, the third transmissive area TA3 may also have a rectangular shape, and may have a rounded corner.

In the third non-transmissive area NTA3 provided with one second common power line VSS21 and the other second common power line VSS22, a width W7 in a second direction perpendicular to a first direction may be equal to the width W4 in a second direction of the first non-transmissive area NTA1 provided in the display area DA.

Each of one second common power line VSS21 and the other second common power line VSS22 may be disposed in the third non-transmissive area NTA3. Therefore, as shown in FIG. 16, each of one second common power line VSS21 and the other second common power line VSS22 may have a width W8 equal to the width W7 of the third non-transmissive area NTA3 or a width W8 narrower than the width W7 of the third non-transmissive area NTA3.

Consequently, the plurality of second common power lines VSS2 disposed in the second non-display area NDA2 may have a width W8 equal to the width W4 in the second direction of the first non-transmissive area NTA1 provided in the display area DA or a width W8 narrower than the width W4 in the second direction of the first non-transmissive area NTA1.

In the transparent display panel 110 according to one embodiment of the present disclosure, the second common power line VSS2 provided in the second non-display area NDA2 does not have a wide width. In the transparent display panel 110 according to one embodiment of the present disclosure, the width W8 of the second common power line VSS2 may be formed to be equal to or narrower than the width W4 of the first non-transmissive area NTA1 provided in the display area DA, whereby the wide third transmissive area TA3 may be obtained in the second non-display area NDA2.

Meanwhile, in the transparent display panel 110 according to one embodiment of the present disclosure, the second common power line VSS2 may be formed in a plural number, whereby a total area of the second common power line VSS2 may be increased.

Moreover, in the transparent display panel 110 according to one embodiment of the present disclosure, the second common power line VSS2 may be formed of a plurality of metal layers to increase its total area.

In detail, the second common power line VSS2 may be provided with a plurality of metal layers. For example, the second common power line VSS2, as shown in FIG. 18, may include a first metal layer VSS2-1 and a second metal layer VSS2-2 provided over the first metal layer VSS2-1. The second common power lines VS S2 may further include a third metal layer VSS2-3 provided over the second metal layer VSS2-2. The first metal layer VSS2-1 and the second metal layer VSS2-2 may partially be overlapped with each other, and may be connected with each other through a seventeenth contact hole CH17. At least a part of the third metal layer VSS2-3 may be overlapped with the second metal layer VSS2-2, and may directly disposed onto the second metal layer VSS2-2.

Here, the first metal layer VSS2-1 of the second common power line VSS2 may be made of an opaque metal material of low resistance. For example, the first metal layer VSS2-1 of the second common power line VSS2 may be provided on the same layer as the source electrode SE and the drain electrode DE of the driving transistor T provided in the display area DA. The first metal layer VSS2-1 may be made of the same material as that of the source electrode SE and the drain electrode DE of the driving transistor T and may be formed simultaneously with them.

The second metal layer VSS2-2 of the second common power line VSS2 may be made of an opaque metal material of low resistance. For example, the second metal layer VSS2-2 of the second common power line VSS2 may be provided on the same layer as the anode auxiliary electrode 115 provided in the display area DA. The second metal layer VSS2-2 may be made of the same material as that of the anode auxiliary electrode 115 and may be formed simultaneously with the anode auxiliary electrode 115. In this case, the second metal layer VSS2-2 of the second common power line VSS2 may be connected to the first metal layer VSS2-1 through a plurality of seventeenth contact holes CH17 that pass through the first planarization film PLN1.

The third metal layer VSS2-3 of the second common power line VSS2 may be made of an opaque metal material of low resistance. For example, the third metal layer VSS2-3 of the second common power line VSS2 may be provided on the same layer as the anode electrode 120 provided in the display area DA. The third metal layer VSS2-3 may be made of the same material as that of the anode electrode 120 and may be formed simultaneously with the anode electrode 120.

In the transparent display panel 110 according to one embodiment of the present disclosure, as each of the plurality of second common power lines VSS2 provided in the second non-display area NDA2 is provided with a plurality of layers, a total area of the second common power line VSS2 may be increased. Therefore, in the transparent display panel 110 according to one embodiment of the present disclosure, even though the width W8 of the second common power line VSS2 is formed to be narrow, whereby resistance of the second common power line VSS2 may be prevented from being increased.

Also, in the transparent display panel 110 according to one embodiment of the present disclosure, as the second metal layer VSS2-2 of the second common power line VSS2 may be connected to the first metal layer VSS2-1 of the second common power line VSS2 through the plurality of seventeenth contact holes CH17, the first metal layer VSS2-1 and the second metal layer VSS2-2 may stably be connected with each other.

Meanwhile, each of the second common power lines VSS2 may electrically be connected with the cathode electrode 140 through a cathode contact part CCT. The cathode contact part CCT may partially remove the bank 125 and partially expose the upper surface of the third metal layer VSS2-3 of the second common power lines VSS2. The cathode contact part CCT may longitudinally expose the upper surface of the third metal layer VSS2-3 of the second common power lines VSS2 along the first direction (X axis direction). As a result, the second common power lines VSS2 may have a wide contact area with the cathode electrode 140, thereby being stably connected to the cathode electrode 140.

Each of the third common power lines VSSL may be extended from the display area DA in a second direction (Y axis direction) and connected with the second common power line VSS2. The third common power line VSSL may be connected to one second common power line VSS21 and the other second common power line VSS22. In detail, each of the third common power lines VSSL may be extended from the display area DA in a second direction (Y axis direction), and thus may be connected with one end of one second common power line VSS21. Also, each of the third common power lines VSSL may be extended from the other end of one second common power line VSS21 in a second direction (Y axis direction), and thus may be connected with one end of the other second common power line VSS22. Therefore, one second common power line VSS21, the other second common power line VSS22 and the third common power lines VSSL may electrically be connected with one another.

The third common power lines VSSL may be formed on the same layer as the second common power line VSS2 in the second non-display area NDA2. In detail, the third common power line VSSL may include a first metal layer VSSL-1 and a second metal layer VSSL-2 in the second non-display area NDA2. The first metal layer VSSL-1 of the third common power line VSSL may be extended from the first metal layer VSS2-1 of the second common power line VSS2, and the second metal layer VSSL-2 of the third common power line VSSL may be extended from the second metal layer VSS2-2 of the second common power line VSS2.

The second pixel power lines VDD2 may be provided between the second common power lines VSS2 and the display area DA as shown in FIG. 16. In this case, the third common power lines VSSL may include one of the first metal layer VSSL-1 and the second metal layer VSSL-2 in the area overlapped with the second pixel power lines VDD2.

For example, in some embodiments, the third common power lines VSSL may include only the first metal layer VSSL-1 of the first metal layer VSSL-1 and the second metal layer VSSL-2 in the area overlapped with the second pixel power lines VDD2 as shown in FIG. 18. Here, the second pixel power lines VDD2 may include only the second metal layer VDD2-2 of the first metal layer VDD2-1 and the second metal layer VDD2-2 in the area overlapped with the third common power lines VSSL.

In the transparent display panel 110 according to one embodiment of the present disclosure, the second common power line VSS2 may be formed in a plural number, and the plurality of second common power lines VSS2 may be spaced apart from one another to form the third transmissive area TA3. Also, in the transparent display panel 110 according to one embodiment of the present disclosure, the second pixel power line VDD2 may be formed in a plural number, and the plurality of second pixel power lines VDD2 may be spaced apart from one another to form the third transmissive area TA3. Therefore, in the transparent display panel 110 according to one embodiment of the present disclosure, since the third transmissive area TA3 is also provided in the non-display area NDA2 like the display area DA, transmittance in the second non-display area NDA2 may be improved.

The transparent display panel 110 according to one embodiment of the present disclosure may have similar transmittance in the second non-display area NDA2 and the display area DA. Accordingly, in some embodiments, in the transparent display panel 110 according to one embodiment of the present disclosure, an area of the first transmissive area TA1 provided in a unit area and an area of the third transmissive area TA3 provided in a unit area may be designed to be equal to each other.

In detail, in one embodiment, the third transmissive area TA3 provided in the second non-display area NDA2 may have the same shape as that of the first transmissive area TA1 provided in the display area DA.

Also, in the transparent display panel 110 according to one embodiment of the present disclosure, a width W10 in the first direction (X axis direction) of the third transmissive area TA3 provided in the second non-display area NDA2 may be equal to a width W9 in the first direction (X axis direction) of the first transmsisive area TA1. This is because that a spaced distance between the third pixel power line VDDL and the third common power line VSSL in the second non-display area NDA2 is equal to a spaced distance between the third pixel power line VDDL and the third common power line VSSL in the display area DA. The width in the first direction (X axis direction) of the transmissive areas TA1 and TA3 may be determined by the spaced distance between the third pixel power line VDDL and the third common power line VSSL.

Also, in the transparent display panel 110 according to one embodiment of the present disclosure, a width W5 or W7 in the second direction (Y axis direction) of the third non-transmissive area NTA3 provided in the second non-display area NDA2 may be equal to the width W4 in the second direction (Y axis direction) of the first non-transmsisive area NTA1.

Therefore, in the transparent display panel 110 according to one embodiment of the present disclosure, transmittance similar to that in the display area DA may be embodied in the second non-display area NDA2.

Moreover, the transparent display panel 110 according to one embodiment of the present disclosure may further include a color filter layer 170 and a black matrix BM in the third non-transmissive area NTA3 of the second non-display area NDA2.

In more detail, color filters CF1, CF2 and CF3 formed over the second pixel power line VDD2, the second common power line VSS2, the third pixel power lines VDDL and the third common power lines VSSL, and the black matrix BM formed among the color filters CF1, CF2 and CF3 may be provided in the third non-transmissive area NTA3 of the second non-display area NDA2. Here, the color filters CF1, CF2 and CF3 may be formed to be patterned in the second non-display area NDA2 in the same shape as that of the color filters CF1, CF2 and CF3 provided in the display area DA.

The color filter layer 170 and the black matrix BM may not be provided in the third transmissive area TA3 of the second non-display area NDA2 as shown in FIG. 19 to enhance transmittance.

Therefore, in the transparent display panel 110 according to one embodiment of the present disclosure, a difference between transmittance in the second non-display area NDA2 and transmittance in the display area DA may be reduced or minimized.

Meanwhile, in the transparent display panel 110 according to one embodiment of the present disclosure, the pixel power line VDD, the common power line VSS and the reference line VREF may be provided in only the first non-display area NDA1 and the second non-display area NDA2 of the non-display area NDA. In the transparent display panel 110 according to one embodiment of the present disclosure, each of the pixel power line VDD, the common power line VSS and the reference line VREF may be formed in a double layer structure, and each of the common power line VSS and the reference line VREF provided in the first non-display area NDA1 may be connected with a plurality of connection electrodes. Therefore, in some embodiments, even though the pixel power line VDD, the common power line VSS and the reference line VREF are provided in only the first non-display area NDA1 and the second non-display area NDA2, the transparent display panel 110 according to one embodiment of the present disclosure may make sure of a sufficient area of each of the pixel power line VDD, the common power line VSS and the reference line VREF and reduce or minimize resistance.

In the transparent display panel 110 according to one embodiment of the present disclosure, as the pixel power line VDD, the common power line VSS and the reference line VREF are not provided in the third non-display area NDA3 and the fourth non-display area NDA4, transmittance in the third non-display area NDA3 and the fourth non-display area NDA4 may be improved. That is, the transparent display panel 110 according to one embodiment of the present disclosure may have transmittance even in the third non-display area NDA3 and the fourth non-display area NDA4, which is similar to that of the display area DA.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent display device, comprising:
    a substrate provided thereon with a display area in which a plurality of subpixels are disposed, and a non-display area adjacent to the display area;
    a gate driver provided in the non-display area on the substrate, including a plurality of stages;
    a metal line provided between the gate driver and the display area;
    a trench provided between the metal line and the display area; and
    a signal output line extending from the gate driver provided in the non-display area to the display area, wherein the signal output line is provided below the metal line in an area overlapping the trench.

2. The transparent display device of claim 1, wherein the metal line is an output test line connected with the gate driver.

3. The transparent display device of claim 1, further including a first insulating film provided over the metal line, wherein the trench passes through the first insulating film.

4. The transparent display device of claim 3, further including a second insulating film provided over the first insulating film, wherein the trench passes through the second insulating film, and the second insulating film overlays at least one side of the first insulating film in the trench.

5. The transparent display device of claim 4, further comprising anode electrodes respectively provided in the plurality of subpixels and a bank provided between the anode electrodes, wherein the second insulating film is formed of substantially the same material as that of the bank on the same layer as the bank.

6. The transparent display device of claim 4, wherein the second insulating film is provided with ends formed between the gate driver and the trench.

7. The transparent display device of claim 4, further comprising an encapsulation film on the second insulating film, filling the trench.

8. The transparent display device of claim 1, wherein the signal output line includes a first layer provided between the gate driver and the trench, a second layer provided between the trench and the display area, and a contact hole electrically connecting the first layer with the second layer,
    wherein the metal line is provided between the first layer and the second layer of the signal output line.

9. The transparent display device of claim 1, wherein the display area includes first non-transmissive areas provided with the plurality of subpixels and a first transmissive area provided between the first non-transmissive areas, and the non-display area includes a second non-transmissive area provided with the plurality of stages and a second transmissive area provided among the plurality of stages, and
    wherein the second transmissive area has substantially the same transmittance as that of the first transmissive area.

10. The transparent display device of claim 9, wherein the non-display area further includes third non-transmissive areas provided with pixel power lines and common power lines for supplying power to the plurality of subpixels, and third transmissive areas provided between the third non-transmissive areas, and
    wherein the third transmissive area has substantially the same transmittance as that of the first transmissive area.

11. The transparent display device of claim 1, further comprising a dam provided between an end of the substrate and the gate driver.

12. The transparent display device of claim 11, further comprising a lighting test line provided between the dam and the gate driver.

13. The transparent display device of claim 12, wherein the lighting test line is configured for testing whether disconnection and defect exist in a plurality of signal lines formed on the substrate.

14. The transparent display device of claim 2, wherein the output test line is configured for testing whether at least one of a gate signal or a light emission control signal is output from the gate driver.

15. A transparent display device, comprising:
    a substrate provided thereon a display area in which a plurality of subpixels are disposed, and a non-display area adjacent to the display area;
    a plurality of metal lines provided in the non-display area over the substrate;
    at least one insulating film provided over the plurality of metal lines and provided with an open area formed between one of the metal lines and the display area; and
    a signal output line extending from a gate driver provided in the non-display area to the display area, wherein the signal output line is provided below the metal lines in an area overlapping the open area.

16. The transparent display device of claim 15, further comprising an encapsulation layer provided over the at least one insulating film,
    wherein the open area is covered and filled by the encapsulation layer.

17. The transparent display device of claim 15, wherein the at least one insulating film includes a planarization film provided over the metal lines, and a bank provided over the planarization film, and
    wherein the planarization film includes a first open area, and the bank includes a second open area having a width narrower than that of the first open area.

18. The transparent display device of claim 17, wherein the bank is provided with ends formed between the metal lines.

19. The transparent display device of claim 15, wherein the metal lines include at least one of an output test line connected with the gate driver provided in the non-display area, and a lighting test line connected with a lighting test transistor provided in the non-display area.

\* \* \* \* \*